United States Patent

Hong et al.

[11] Patent Number: 6,077,402
[45] Date of Patent: Jun. 20, 2000

[54] CENTRAL COIL DESIGN FOR IONIZED METAL PLASMA DEPOSITION

[75] Inventors: Liubo Hong, San Jose; Hougong Wang, Cupertino; Gongda Yao, Fremont; Zheng Xu, Foster City, all of Calif.

[73] Assignee: Applied Materials, Inc., Santa Clara, Calif.

[21] Appl. No.: 08/857,719

[22] Filed: May 16, 1997

[51] Int. Cl.⁷ ..................................................... C23C 14/34
[52] U.S. Cl. ............................... 204/192.12; 204/298.06; 204/298.09; 204/298.11
[58] Field of Search ........................ 204/192.12, 298.06, 204/298.09, 298.11

[56] References Cited

U.S. PATENT DOCUMENTS

| | | | |
|---|---|---|---|
| 3,619,402 | 11/1971 | Wurm | 204/298 |
| 4,336,118 | 6/1982 | Patten et al. | |
| 4,361,472 | 11/1982 | Morrison, Jr. | 204/192 R |
| 4,362,632 | 12/1982 | Jacob . | |
| 4,422,896 | 12/1983 | Class et al. | |
| 4,626,312 | 12/1986 | Tracy . | |
| 4,661,228 | 4/1987 | Mintz . | |
| 4,716,491 | 12/1987 | Ohno et al. | |
| 4,792,732 | 12/1988 | O'Loughlin . | |
| 4,842,703 | 6/1989 | Class et al. | |

(List continued on next page.)

FOREIGN PATENT DOCUMENTS

| | | |
|---|---|---|
| 0520519 | 12/1992 | European Pat. Off. |
| 0601595 | 12/1993 | European Pat. Off. |
| 0607797 | 1/1994 | European Pat. Off. |
| 0653776 | 10/1994 | European Pat. Off. |
| 0727807 | 1/1996 | European Pat. Off. |

(List continued on next page.)

OTHER PUBLICATIONS

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built-in High Frequency Coil Type Sputtering Apparatus," *J. Vac. Sci. Technol.*, vol. A7, pp. 151–158, 1989.

S.M. Rossnagel et al., "Metal Ion Deposition for Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y-W. Kim et al., "Ionized Sputter Deposition of AlCu: Film Microstructure and Chemistry," *J. Vac. Sci. Technol.*, vol. A12, pp. 3169–3175, 1994.

J. Hopwood et al., "Mechanism for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

*Primary Examiner*—Nam Nguyen
*Assistant Examiner*—Julian A. Mercado
*Attorney, Agent, or Firm*—Konrad Raynes & Victor

[57] ABSTRACT

In a plasma generating apparatus, a coil is positioned between a target and a workpiece to inductively couple RF energy into a plasma so that the paths of a portion of the ionized deposition material are deflected from the center of the workpiece and toward the edges of the workpiece. As a consequence, it has been found that the uniformity of deposition may be improved. In the illustrated embodiment, the coil is a multi-turn coil formed in a generally planar spiral centered in the stream of deposition material.

52 Claims, 17 Drawing Sheets

U.S. PATENT DOCUMENTS

| | | |
|---|---|---|
| 4,844,775 | 7/1989 | Keeble . |
| 4,865,712 | 9/1989 | Mintz . |
| 4,871,421 | 10/1989 | Ogle et al. . |
| 4,918,031 | 4/1990 | Flamm et al. . |
| 4,925,542 | 5/1990 | Kidd . |
| 4,941,915 | 7/1990 | Matsuoka et al. . |
| 4,948,458 | 8/1990 | Ogle ........................................ 156/643 |
| 4,990,229 | 2/1991 | Campbell et al. . |
| 4,999,096 | 3/1991 | Nihei et al. . |
| 5,065,698 | 11/1991 | Koike . |
| 5,091,049 | 2/1992 | Campbell et al. . |
| 5,102,496 | 4/1992 | Savas . |
| 5,122,251 | 6/1992 | Campbell et al. . |
| 5,135,629 | 8/1992 | Sawada et al. . |
| 5,135,634 | 8/1992 | Clarke . |
| 5,146,137 | 9/1992 | Gesche et al. . |
| 5,175,608 | 12/1992 | Nihei et al. . |
| 5,178,739 | 1/1993 | Barnes et al. . |
| 5,198,725 | 3/1993 | Chen et al. . |
| 5,206,516 | 4/1993 | Keller et al. . |
| 5,225,740 | 7/1993 | Ohkawa . |
| 5,231,334 | 7/1993 | Paranjpe . |
| 5,234,560 | 8/1993 | Kadlec et al. . |
| 5,241,245 | 8/1993 | Barnes et al. . |
| 5,280,154 | 1/1994 | Cuomo et al. . |
| 5,304,279 | 4/1994 | Coultas et al. . |
| 5,312,717 | 5/1994 | Sachdev et al. . |
| 5,346,578 | 9/1994 | Benzing et al. . |
| 5,361,016 | 11/1994 | Ohkawa et al. . |
| 5,366,590 | 11/1994 | Kadomura . |
| 5,368,685 | 11/1994 | Kumihashi et al. . |
| 5,397,962 | 3/1995 | Moslehi . |
| 5,401,350 | 3/1995 | Patrick et al. ........................ 156/345 |
| 5,404,079 | 4/1995 | Ohkuni et al. . |
| 5,418,431 | 5/1995 | Williamson et al. . |
| 5,421,891 | 6/1995 | Campbell et al. . |
| 5,429,070 | 7/1995 | Campbell et al. . |
| 5,429,710 | 7/1995 | Akiba et al. . |
| 5,429,995 | 7/1995 | Nishiyama et al. . |
| 5,430,355 | 7/1995 | Paranjpe . |
| 5,433,812 | 7/1995 | Cuomo et al. . |
| 5,434,353 | 7/1995 | Kraus . |
| 5,464,476 | 11/1995 | Gibb et al. . |
| 5,503,676 | 4/1996 | Shufflebotham et al. . |
| 5,525,159 | 6/1996 | Hama et al. . |
| 5,556,501 | 9/1996 | Collins et al. ........................ 156/345 |
| 5,573,595 | 11/1996 | Dible . |
| 5,639,357 | 6/1997 | Xu . |
| 5,650,032 | 7/1997 | Keller et al. . |
| 5,669,975 | 9/1997 | Ashtiani .................................. 118/723 |
| 5,683,537 | 11/1997 | Ishii ........................................ 156/345 |
| 5,690,781 | 11/1997 | Yoshida et al. . |
| 5,707,498 | 1/1998 | Ngan .................................. 204/192.12 |
| 5,721,021 | 2/1998 | Tobe et al. ............................. 427/570 |
| 5,763,851 | 6/1998 | Forster et al. . |
| 5,770,098 | 6/1998 | Araki et al. ............................. 216/67 |
| 5,783,492 | 7/1998 | Higuchi et al. ........................ 438/710 |
| 5,795,429 | 8/1998 | Ishii et al. . |
| 5,810,931 | 9/1998 | Stevens et al. . |
| 5,851,600 | 12/1998 | Horiike et al. . |
| 5,874,704 | 2/1999 | Gates . |

FOREIGN PATENT DOCUMENTS

| | | |
|---|---|---|
| 0727923 | 2/1996 | European Pat. Off. . |
| 0758148 | 8/1996 | European Pat. Off. . |
| 0807954 | 11/1997 | European Pat. Off. . |
| 59-190363 | 10/1984 | Japan . |
| 7176398 | 5/1986 | Japan . |
| 1190070 | 8/1986 | Japan . |
| 63-246814 | 10/1988 | Japan . |
| 6232055 | 8/1994 | Japan . |
| 6283470 | 10/1994 | Japan . |
| 7106095 | 4/1995 | Japan . |
| 7176398 | 7/1995 | Japan . |
| 7176399 | 7/1995 | Japan . |
| 7245271 | 9/1995 | Japan . |
| 888190 | 4/1996 | Japan . |
| 8153712 | 6/1996 | Japan . |
| 8288259 | 11/1996 | Japan . |
| 2162365 | 1/1986 | United Kingdom . |
| 2231197 | 11/1990 | United Kingdom . |
| WO860623 | 11/1986 | WIPO . |
| 9515672 | 6/1995 | WIPO . |

OTHER PUBLICATIONS

W.M. Holber et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP* (Tokyo), pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul/Aug 1989.

U.S. application No. 08/680,335, filed Jul. 10, 1996.

N. Jiwari et al., "Helicon wave plasma reactor employing single–loop antenna," *J. of Vac. Sci. Technol.*, A (12)4, pp. 1322–1327, Jul/Aug 1994.

Search report dated Feb. 27, 1997, EPC application No. 96308251.6.

U.S. application No. 08/461,575, filed Sep. 30, 1992.
U.S. application No. 08/310,617, filed Sep. 30, 1992.
U.S. application No. 08/567,601, filed Jun. 2, 1995.
U.S. application No. 08/559,345, filed Nov. 15, 1995.
U.S. application No. 08/733,620, filed Oct. 17, 1996.
U.S. application No. 08/741,708, filed Oct. 31, 1996.
U.S. application No. 08/846,335, filed May 14, 1997.
U.S. application No. 08/853,024, filed May 8, 1997.
U.S. application No. 08/851,946, filed May 6, 1997.
U.S. application No. 08/857,720.
U.S. application No. 08/857,921.
U.S. application No. 08/857,944.
U.S. application No. 08/907,382.
U.S. application No. 08/908,341.
U.S. application No. 08/908,342.
U.S. application No. 08/931,170.
U.S. application No. 08/971,867.
U.S. application No. 09/039,695.
U.S. application No. 09/049,276.
U.S. application No. 09/049,839.
PCT Search Report issued in Appln PCT/US98/09739.
Search report in PCT/US98/10058 issued Nov. 4, 1998.
U.S. application No. 08/856,335, filed May 14, 1997.

Hayden, D.B., et al., "Characterization of magnetron–sputtered partially ionized aluminum deposition," J. Vac. Sci. Technol. A 16(2), 624–627.

Schneider, Jochen M., et al., "Crystalline alumina deposited at low temperature by ionized magnetron sputtering," J. Vac. Sci. Technol. A15(3), pp. 1084–1088.

U.S. patent application serial No. 09/064,355, filed Apr. 22, 1999 (Atty. Dk. 1901/PVD/DV).

PCT/US98/10058 PCT Written Opinion issued May 7, 1999.

CENTRAL COIL DESIGN FOR IONIZED METAL PLASMA DEPOSITION

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate being deposited, at angles which are oblique to the surface of the substrate. As a consequence, materials deposited in etched openings including trenches and holes of semiconductor devices having openings with a high depth to width aspect ratio, may not adequately coat the walls of the openings, particularly the bottom walls. If a large amount of material is being deposited, the deposited material can bridge over causing undesirable cavities in the deposition layer. To prevent such cavities, sputtered material can be redirected into substantially vertical paths between the target and the substrate by negatively biasing (or self biasing) the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

Although ionizing the deposition material facilitates deposition of material into high aspect ratio channels and vias, a high density plasma can cause substantial scattering of the deposition material. As a result, many sputtered contact metals when ionized in a high density plasma have a tendency to deposit more thickly in the center of the wafer as compared to the edges. This "center thick" deposition profile is undesirable in many applications where a uniformity of deposition thickness is needed.

SUMMARY OF THE PREFERRED EMBODIMENTS

It is an object of the present invention to provide an improved method and apparatus for sputter depositing a layer which enhances uniformity of deposition of sputtered material.

These and other objects and advantages are achieved by a plasma generating apparatus in which in accordance with one aspect of the invention, a coil is positioned between a target and a workpiece to inductively couple RF energy into a plasma so that the paths of a portion of the ionized deposition material are deflected from the center of the workpiece and toward the edges of the workpiece. As a consequence, it has been found that the uniformity of deposition may be improved.

In the illustrated embodiment, the coil is a multi-turn coil formed in a generally planar spiral. Although positioning the coil between the target and the workpiece may cause the coil to block some of the deposition of sputtered material from reaching the workpiece, it is believed that the improvement in uniformity is a result primarily of the plasma potential gradient generated by the coil. As explained in greater detail below, it is believed that the coil forms a plasma density gradient and an associated plasma potential gradient which are shaped so as to deflect ionized deposition material away from the center of the workpiece. As a consequence, the amount of material deposited at the edges is increased relative to that deposited in the center. Hence, the uniformity of the thickness of the deposition may be improved.

DETAILED DESCRIPTION OF THE DRAWINGS

Figure 1:
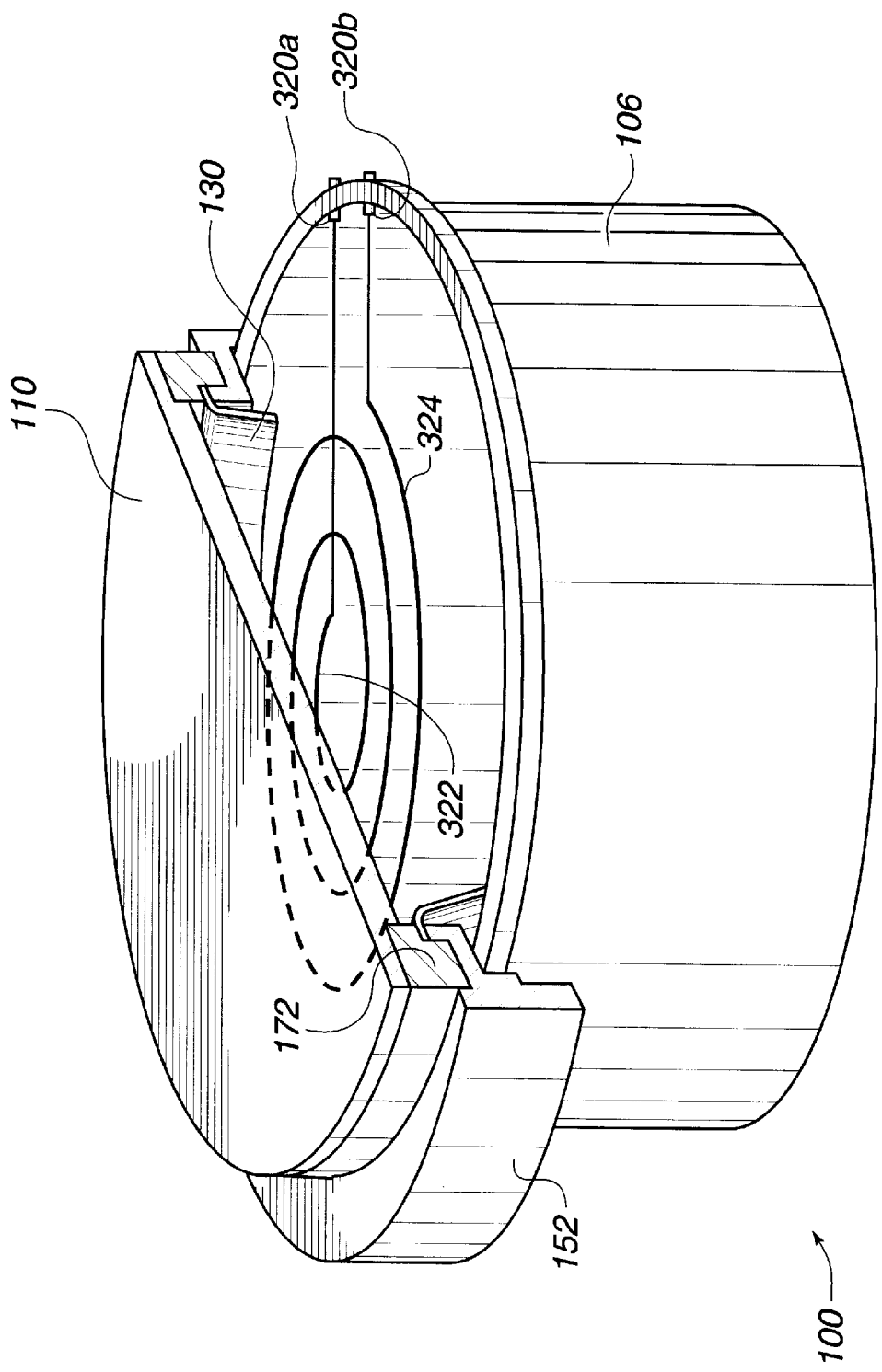
FIG. 1 is a perspective, partial cross-sectional view of a plasma generating chamber in accordance with an embodiment of the present invention.
Figure 2:
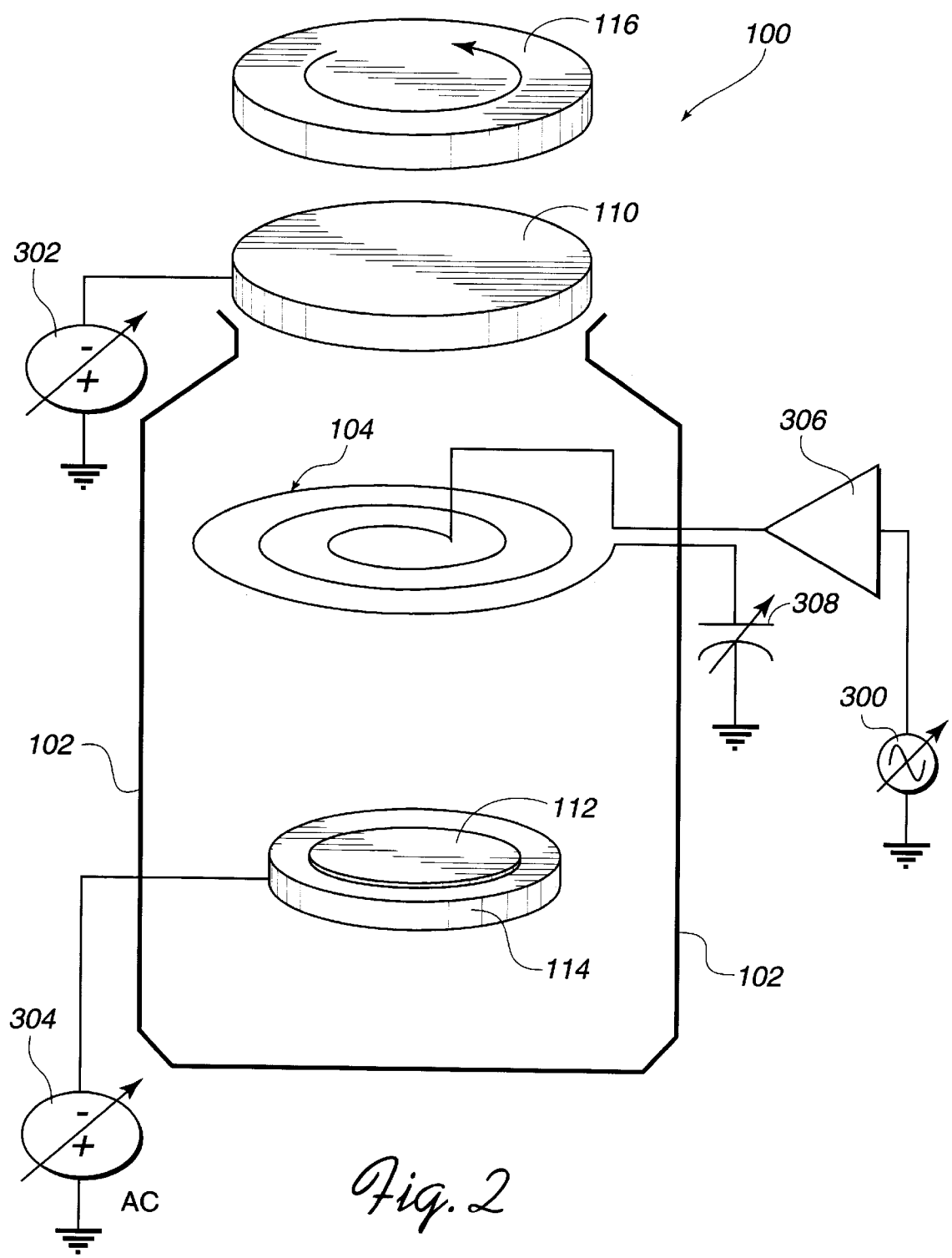
FIG. 2 is a schematic diagram of the electrical interconnections to the plasma generating chamber of FIG. 1.

Referring first to FIGS. 1–2, a plasma generator in accordance with one embodiment of the present invention comprises a substantially cylindrical plasma chamber 100 which is received in a vacuum chamber 102 (represented schematically in FIG. 2). The plasma chamber 100 of this embodiment has a coil 104 carried internally of the vacuum chamber walls by a chamber shield 106. The chamber shield 106 protects the interior walls of the vacuum chamber 102 from the material being deposited within the interior of the plasma chamber 100.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

Radio frequency (RF) energy from an RF generator 300 (FIG. 2) is radiated from the coil 104 into the interior of the plasma chamber 100, which energizes a plasma within the plasma chamber 100. The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

As will be explained in greater detail below, in accordance with one aspect of the present invention, the coil 104 is positioned between the target 110 and the substrate 112 in the path of the material being sputtered toward the workpiece. In addition, the coil 104 is shaped in a manner which is believed to cause the potential of the plasma energized by the coil 104 to have a gradient which deflects the path of ionized metal material passing through the plasma. In the illustrated embodiment, the coil 104 has a generally planar spiral shape which increases the density of the plasma in the center of the chamber to define a plasma density gradient and hence a plasma potential gradient which are sufficiently sharp to deflect a portion of the ionized metal material from the center of the wafer toward the edge to improve deposition uniformity.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be negatively biased by a variable RF power source 304 to bias the substrate 112 negatively to attract the ionized deposition material to the substrate 112. In an alternative embodiment, the pedestal 114 may be biased by a high frequency AC power source to bias the substrate 112 so as to attract the ionized deposition material more uniformly to the substrate 112. In yet another alternative embodiment, as set forth in copending application Ser. No. 08/677,588, entitled "A Method for Providing Full-face High Density Plasma Physical Vapor Deposition," filed Jul. 9, 1996 (Attorney Docket No. 1402/PVD/DV) and assigned to the assignee of the present application, an external biasing of the substrate 112 may be omitted.

One end of the coil 104 is coupled to an RF source such as the output of an amplifier and matching network 306, the input of which is coupled to the RF generator 300. The other end of the coil 104 is coupled to ground, preferably through a capacitor 308, which may be a variable capacitor.

The coil 104 is carried on the vacuum chamber wall 102 by a plurality of coil feedthroughs 320a, 320b (FIG. 1) which electrically insulate the coil 104 from the supporting chamber shield 106 and the wall 102. The insulating coil feedthroughs have an internal labyrinth structure which permits repeated deposition of conductive materials from the target 110 onto the coil feedthroughs while preventing the formation of a complete conducting path of deposited material from the coil 104 to the chamber shield 106. Such a completed conducting path is undesirable because it could short the coil 104 to the chamber shield 106 (which is typically grounded). The feedthrough is coupled to the RF generator 300 (shown schematically in FIG. 2) through the matching network 306 (also shown schematically in FIG. 2). Water is also supplied to the coil 104 through the feedthroughs to act as a coolant.

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112. In accordance with one aspect of the invention, the plasma generated by the coil 104 is formed in such a manner as to facilitate use for another purpose—that is to deflect sputtered material from the target in such a manner as to modify the deposition profile of the deposited material to be more uniform.

Figure 3:
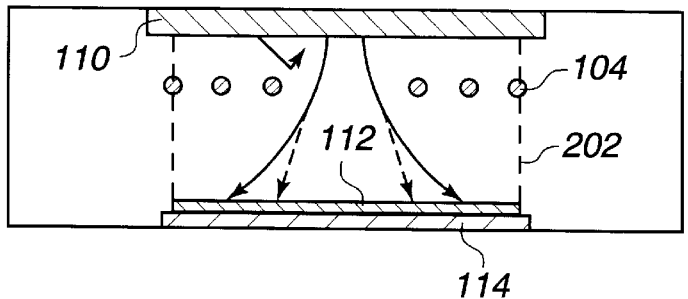
FIG. 3 is a schematic cross-sectional view of the plasma chamber of FIG. 1.

FIG. 3 is a schematic cross-sectional representation of the plasma chamber of FIG. 1. As shown therein, the RF coil 104 is positioned between the target 110 and the substrate 112 so that the coil 104 is positioned directly in the deposition stream (as represented by the arrows 200) of material being sputtered from the target 110 to the substrate 112. In addition, the coil 104 is shaped in a manner which is believed to cause the potential of the plasma energized by the coil 104 have a gradient which deflects the path of ionized metal material passing through the plasma. In the illustrated embodiment, the coil 104 has a generally planar spiral shape which increases the density of the plasma in the center of the chamber to define a plasma potential gradient which is sufficiently sharp to deflect a portion of the ionized metal material from the center of the substrate toward the edge to improve deposition uniformity.

Figure 4:
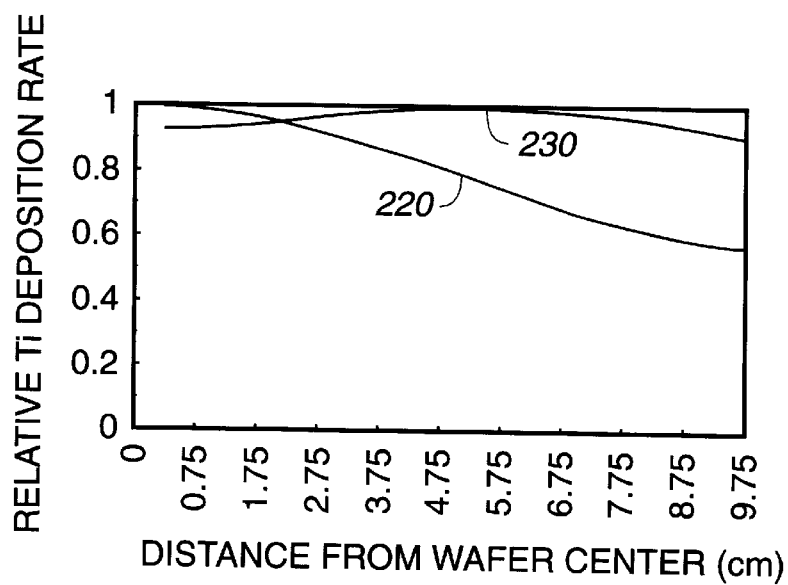
FIG. 4 is a graph depicting deposition rate as a function of distance from the wafer center for the chamber of FIG. 1 and for a prior chamber.

In prior designs, the coil has been placed off to the sides of the chamber (see FIG. 7) so that particulate matter shed by the coil is less likely to fall onto the substrate. However, the deposition profile for materials deposited in a plasma ionization chamber having such side mounted coils tends to be somewhat center thick as represented by the line 220 in FIG. 4. In contrast, by placing the coil 104 directly over the workpiece in the path of the material being deposited onto the workpiece, it has been found that a plasma potential gradient can be created which deflects a portion of the deposition stream away from the center of the workpiece and toward the periphery. As a result, the deposition profile can be made substantially more uniform as represented by the line 230 in FIG. 4. As shown therein, the deposition thickness is more uniform as measured at the center and at the periphery as compared to the deposition profile represented by line 220.

In the embodiment of FIG. 3, the periphery of the substrate 112 defines a cylindrical volume 202 between the substrate 112 and the target 110. The spiral coil 104 is positioned in this volume 202 so that the outer periphery (i.e. the outer turn) of the coil 104 coincides with the lateral boundary of the volume 202. Thus, a majority of the coil 104 is within the boundary of the volume 202. As a consequence, the turns of the coil 104 intercept deposition material which would otherwise be deposited onto the substrate. Because material is deposited onto the coil 104 rather than the substrate, the coil 104 will block a certain percentage of the deposition material from reaching the substrate. However, it is believed that improvements in uniformity are primarily a function of the deflecting action of the coil rather than the blocking action of the coil.

Figure 5:
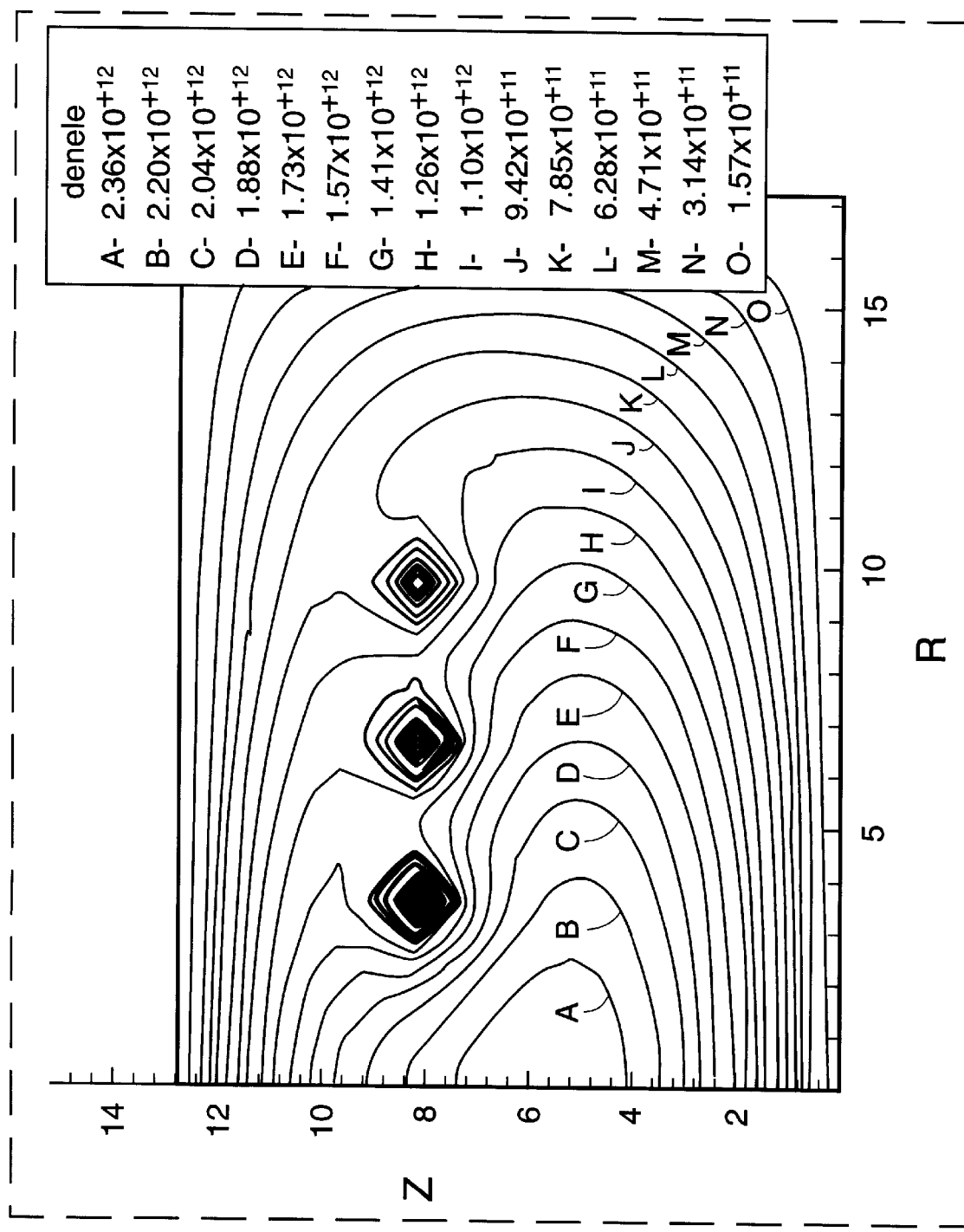
FIG. 5 is a graph depicting a computer simulation of the plasma density of the plasma generated by the coil of the chamber of FIG. 1.

FIG. 5 is a graphical representation of the plasma density profile of a computer simulation of the plasma created by the coil 104. As shown by the equidensity lines A–O, the plasma density is very nonuniform. The gradient from one plasma density to another density is represented by the spacing between the lines A–O. The relatively close spacing of the gradient lines A–O of the plasma density produced by the coil 104 indicates that the plasma density is relatively nonuniform. This nonuniformity is present both vertically and horizontally through the plasma. In the profile of FIG. 5, the plasma density decreases by approximately one half order of magnitude over a horizontal distance of 10 cm from the center of the wafer to the wafer edge.

It is believed that the plasma potential is related to the plasma density. Hence, the plasma potential of the plasma 118 is very nonuniform as well. It is further believed that the plasma density and hence the plasma potential are distributed in the plasma 118 in such a way as to deflect the path of the ionized deposition material passing through the plasma 118.

Figure 6:
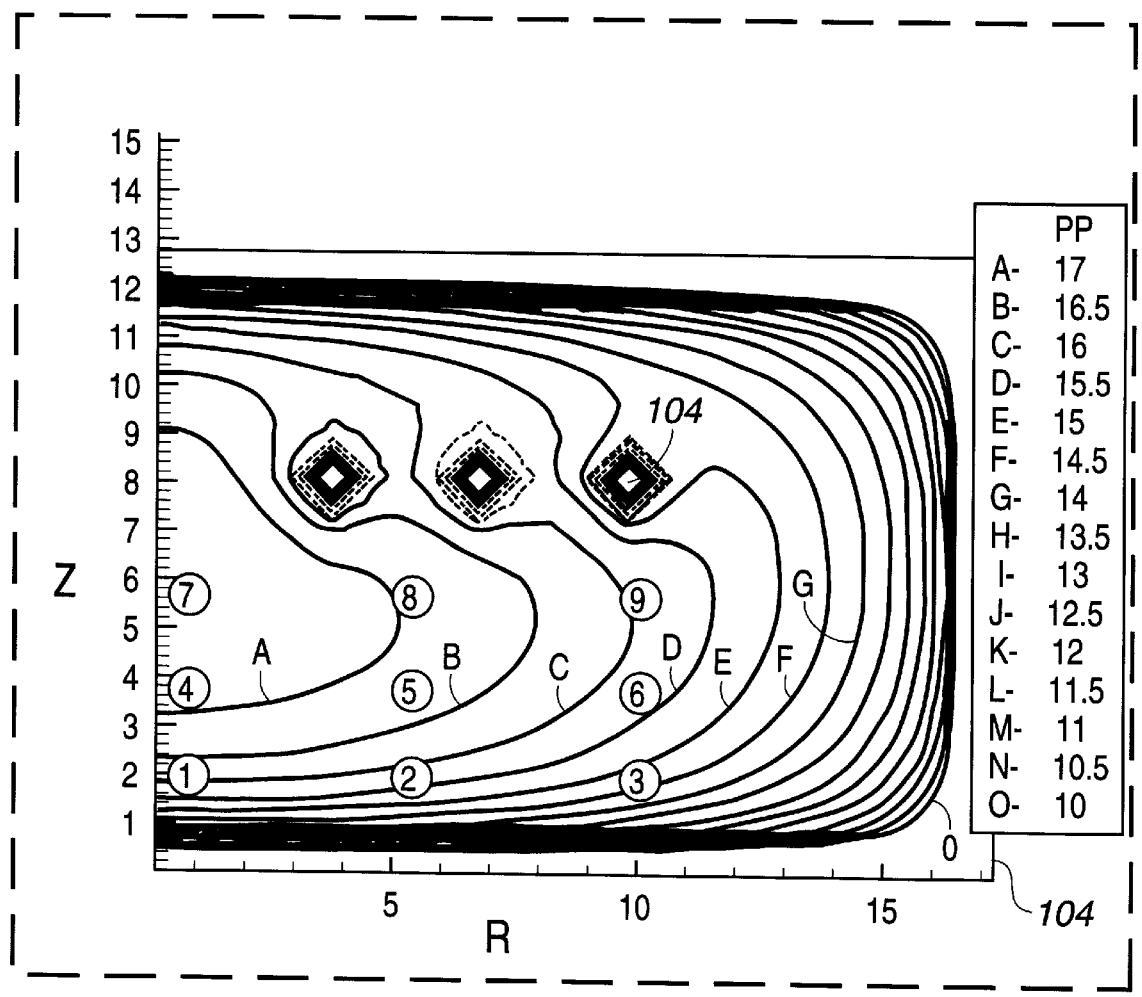
FIG. 6 is a graph depicting a computer simulation of the potential of the plasma generated by the coil of the chamber of FIG. 1.

FIG. 6 illustrates a computer simulation of the plasma potential profile as represented by equipotential lines A–O, which is created within the interior space enclosed by shield 106 when a coil 104 according to this first embodiment is utilized to produce the plasma. The spacing between the equipotential lines A–O represents a change in plasma potential of approximately 0.5 v. It should be readily apparent from FIG. 6 that equipotential lines A–O are closely spaced and non-parallel to the upper surface of substrate 112 over substantially the entire width, or diameter of the substrate, indicating a relatively sharp potential gradient. It has been found that the plasma potential gradient produced by the coil 104 and as represented in FIG. 6 is shaped in such a manner as to deflect ionized deposition material away from the center of the substrate and toward the periphery of the substrate. As a consequence, the center thick propensity of many application processes can be offset such that increased uniformity of deposition may be achieved.

Superimposed on the portion of shield 106 shown in FIG. 6 is a coordinate system representing distances from an origin whose abscissa value is the central axis of substrate 112 and whose ordinate value is an arbitrarily selected point above the upper surface of substrate 112. The abscissa scale of this coordinate system is designated R and the ordinate thereof is designated Z. It will be seen that the upper surface of substrate 112 has an ordinate value of Z≈0 cm. Exemplary values for the plasma potential voltage calculated at nine selected points in the RF field illustrated in FIG. 6 are shown in the following table. Points 1,4 and 7 are vertically aligned at R=0.5 and are close to the central axis of the coil 104 and the substrate 112. Points 3,6 and 9 are at R=10 and are vertically aligned with the edge of the substrate 112. Points 2, 5 and 8 are vertically aligned at the midpoint R=5.

TABLE 1

Plasma Potential For Coil 104

| | R = 0.5 cm | R = 5 cm | R = 10 cm |
|---|---|---|---|
| Z = 2 cm | Point 1: 15.9036 v | Point 2: 15.5616 v | Point 3: 14.4548 v |
| Z = 4 cm | Point 4: 17.1856 v | Point 5: 16.8344 v | Point 6: 15.7541 v |
| Z = 6 cm | Point 7: 17.4539 v | Point 8: 16.9874 v | Point 9: 15.9143 v |

Figure 7:
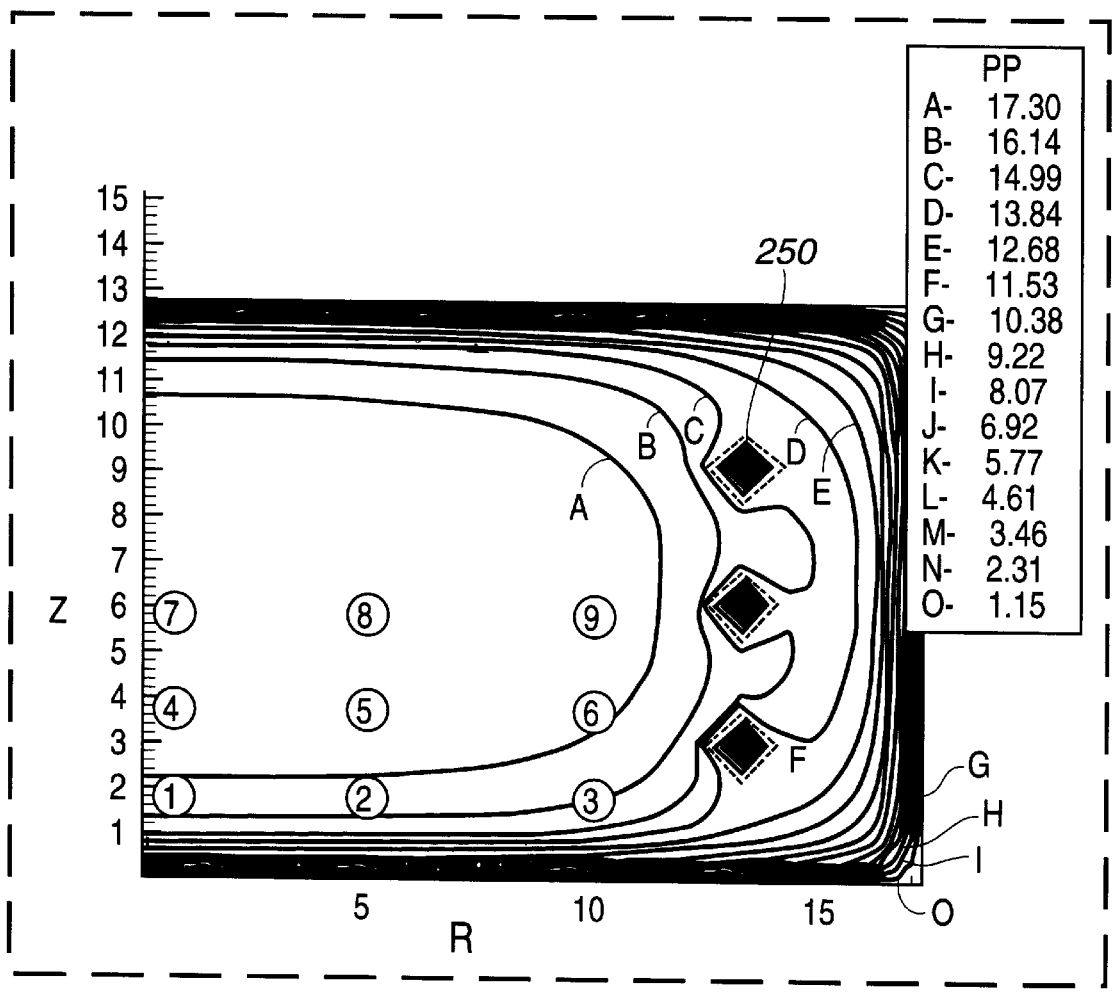
FIG. 7 is a graph depicting a computer simulation of the potential of the plasma generated by a prior coil.

FIG. 7 illustrates a second computer simulation of the equipotential lines A–O which are created within the interior space enclosed by shield 106 when a prior helix coil 250 is utilized to produce the plasma. It is apparent from FIG. 7 that equipotential lines extend essentially parallel to the upper surface of substrate 112 over much if not substantially the entire width, or diameter of the substrate, indicating a relatively flat potential gradient in the horizontal direction.

Exemplary values for the plasma potential voltage calculated at the same nine selected points of FIG. 6 but here in the RF field illustrated in FIG. 7 are shown in the following table.

TABLE 2

Plasma Potential For Coil 250

| | R = 0.5 cm | R = 5 cm | R = 10 cm |
|---|---|---|---|
| Z = 2 cm | Point 1: 16.8409 v | Point 2: 16.7817 v | Point 3: 16.1276 v |
| Z = 4 cm | Point 4: 18.1050 v | Point 5: 18.0612 v | Point 6: 17.5370 v |
| Z = 6 cm | Point 7: 18.4310 v | Point 5: 18.3906 v | Point 9: 17.9123 v |

It is apparent from the plasma potential values calculated for the above selected points of the plasma, that the potential gradient for the coil 250 is relatively flat across the surface of the substrate 112, particularly at elevation Z=2 and the central portion of the wafer between R=0 and R=5. The increased potential gradient of the plasma generated by the coil 104 in accordance with the present invention as compared to the coil 250 may be quantized over exemplary selected distances (when no external bias (RF or DC) is applied to the wafer or substrate) as follows:

TABLE 3

| Potential Gradient: | Spanning Distance: |
|---|---|
| $\Delta V_{pp} > 0.75$ v | Between Points 4 and 6 |
| $\Delta V_{pp} > 0.25$ v | Between Points 4 and 5 |
| $\Delta V_{pp} > 0.65$ v | Between Points 5 and 6 |
| $\Delta V_{pp} > 0.75$ v | Between Points 1 and 3 |
| $\Delta V_{pp} > 0.25$ v | Between Points 1 and 2 |
| $\Delta V_{pp} > 0.7$ v | Between Points 2 and 3 |
| $\Delta V_{pp} > 0.65$ v | Between Points 7 and 9 |
| $\Delta V_{pp} > 0.25$ v | Between Points 7 and 8 |
| $\Delta V_{pp} > 0.55$ v | Between Points 8 and 9 |

Thus, the potential gradient between points 4 and 6, for example, is such that the calculated plasma potential changes at least 0.75 volts in the simulation of the plasma created by the coil 104, as compared to a change of less than 0.5 volts in the potential of the simulation of the plasma created by the coil 250 over the same distance in the corresponding location of the plasmas.

Figure 8:
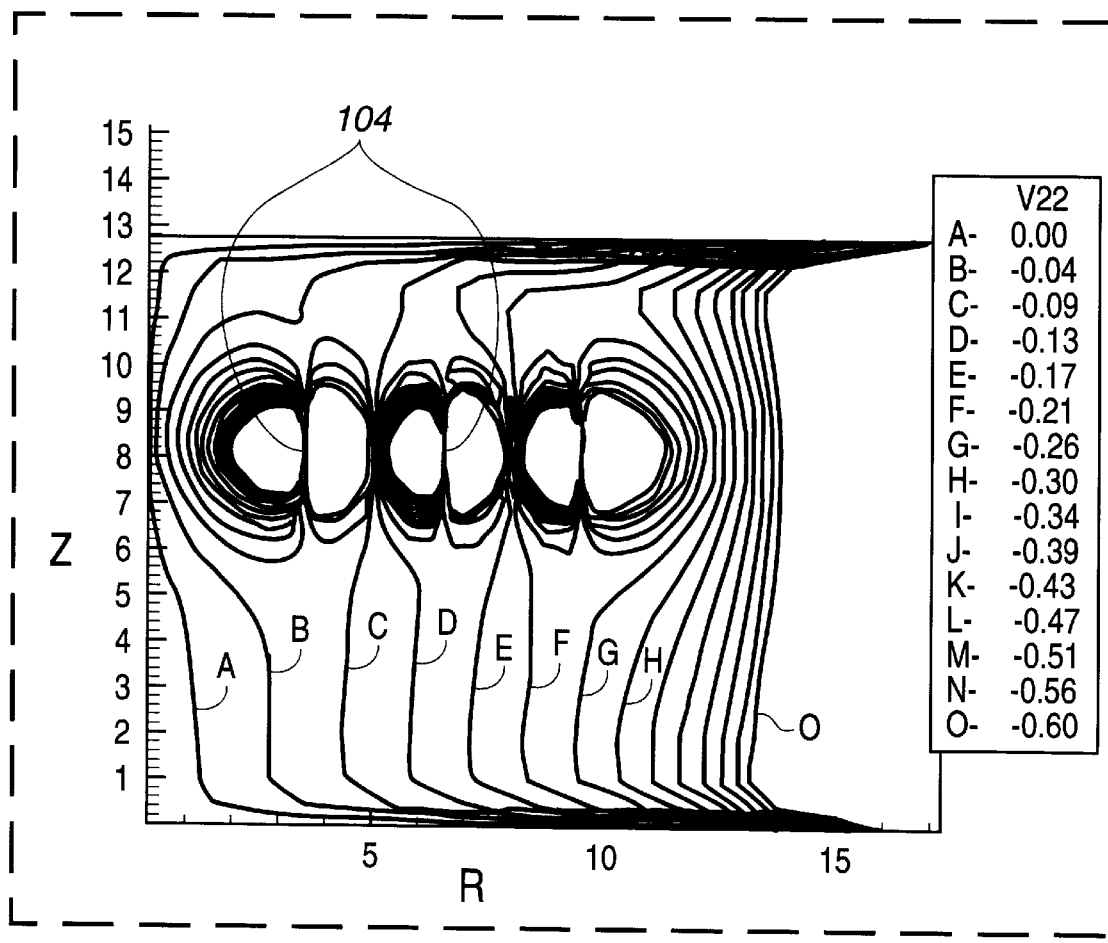
FIG. 8 is a graph depicting a computer simulation of the plasma potential gradient of the plasma generated by the coil of the chamber of FIG. 1.

FIG. 8 illustrates a computer simulation of the plasma potential gradient profile as represented by equigradient lines A–O created within the interior space enclosed by shield 106 when the coil 104 is used. Each equigradient line A–O represents a portion of the plasma in which the plasma potential gradient ($\Delta V/\Delta R$) equals a particular value. The values are selected for the equigradient lines such that the gradient changes by approximately 0.04 or 0.05 from one equigradient line to the next. It should be readily apparent from FIG. 8 that the plasma equigradient lines are relatively equally spaced from a point aligned with the center of the wafer (R=0) to a point aligned with edge of the wafer (R=10) in the zone generally between the coil and the wafer, indicating a well distributed potential gradient.

Exemplary values for the potential gradient calculated at nine selected points in the RF field illustrated in FIG. 8 are shown in the following table. As set forth above, points 1,4 and 7 are vertically aligned at R=0.5 and are close to the central axis of the coil 104 and the substrate 112. Points 3,6 and 9 are at R=10 and are vertically aligned with the edge of the substrate 112. Points 2, 5 and 8 are vertically aligned at the midpoint R=5.

TABLE 4

Potential Gradient For Coil 104

|  | R = 0.5 cm | R = 5 cm | R = 10 cm |
|---|---|---|---|
| Z = 2 cm | Point 1: −0.020751 v/cm | Point 2: −0.146712 v/cm | Point 3: −0.326585 v/cm |
| Z = 4 cm | Point 4: −0.023531 v/cm | Point 5: −0.14302 v/cm | Point 6: −0.311828 v/cm |
| Z = 6 cm | Point 7: −0.042046 v/cm | Point 8: −0.147053 v/cm | Point 9: −0.26342 v/cm |

Figure 9:
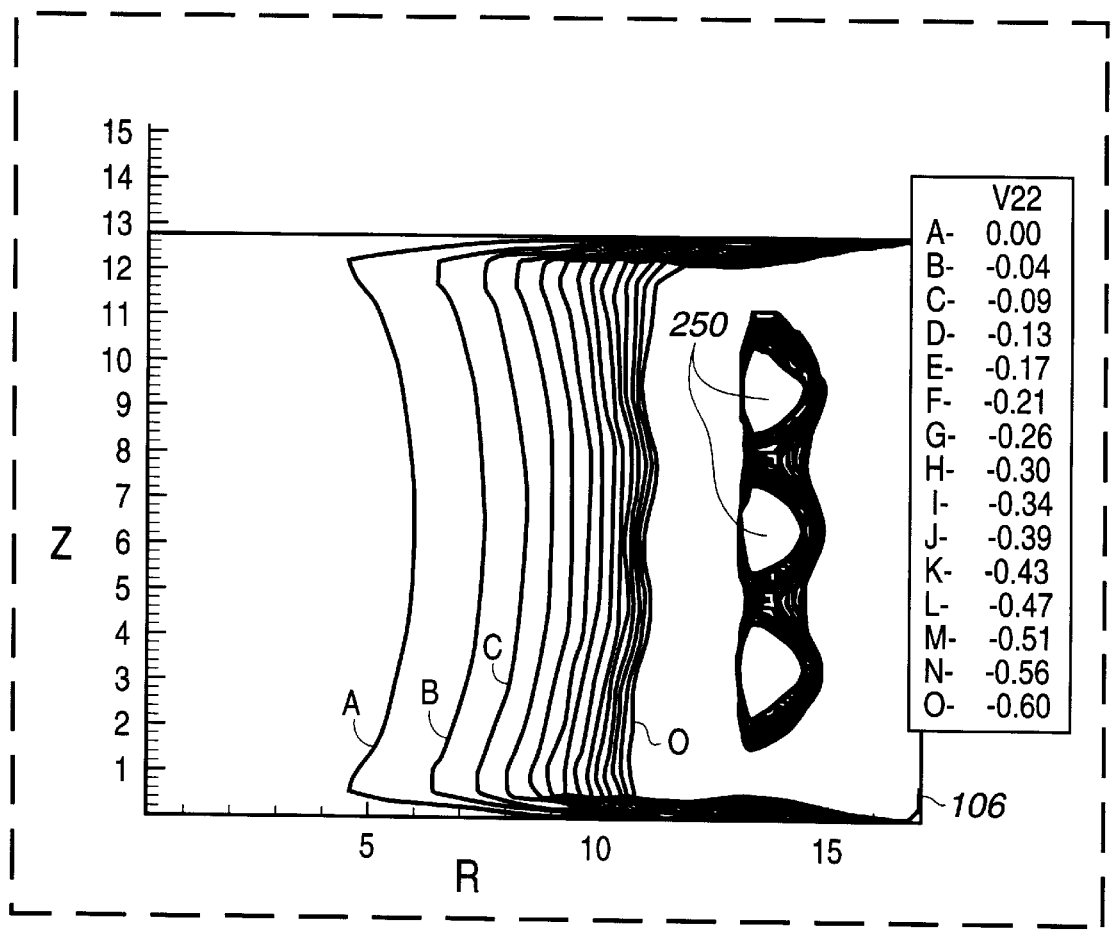
FIG. 9 is a graph depicting a computer simulation of the plasma potential gradient of the plasma generated by a prior coil.

FIG. 9 illustrates a second computer simulation of the equigradient lines of the plasma which is created within the interior space enclosed by shield 106 when the prior helix coil 250 is utilized to produce the plasma. It is apparent from FIG. 9 that equigradient lines are much more closely spaced and are congregated primarily in the zone aligned with the wafer edge, indicating that the plasma gradient changes relatively little in the interior zones of the plasma and begins to change rapidly in the zone adjacent to the wafer edge.

Exemplary values for the plasma potential gradient calculated at the same nine selected points of FIG. 8 but here in the RF field illustrated in FIG. 9 are shown in the following table.

TABLE 5

Potential Gradient For Coil 250

|  | R = 0.5 cm | R = 5 cm | R = 10 cm |
|---|---|---|---|
| Z = 2 cm | Point 1: −0.002266 v/cm | Point 2: −0.037413 v/cm | Point 3: −0.40111 v/cm |
| Z = 4 cm | Point 4: −0.001511 v/cm | Point 5: −0.029323 v/cm | Point 6: −0.31951 v/cm |
| Z = 6 cm | Point 7: −0.001387 v/cm | Point 8: −0.027077 v/cm | Point 9: −0.298647 v/cm |

It is apparent from the potential gradient values calculated for the above selected points of the simulation of the plasma, that the potential gradient for the coil 250 is relatively flat across the surface of the substrate 112, particularly at elevation Z=2 and the central portion of the wafer between R=0 and R=5. The increased potential gradient of the plasma generated by the coil 104 in accordance with the present invention in the interior zones as compared to the coil 260 may be quantized over exemplary selected distances as follows:

TABLE 6

| Potential Gradient: | Location: |
|---|---|
| $|dV_{pp}/dR| \geq 0.01$ v/cm | R = 0.5 cm |
| $|dV_{pp}/dR| \geq 0.07$ v/cm | R = 5 cm |

Thus, the potential gradient in the zone adjacent to the center of the wafer, for example, is such that the magnitude (absolute value) of the potential gradient is at least 0.01 v/cm in the plasma created by the coil 104, as compared to 0.002266, which is the magnitude calculated for the potential gradient of the simulated plasma created by the coil 250 in the zone adjacent to the wafer center.

Figure 10:
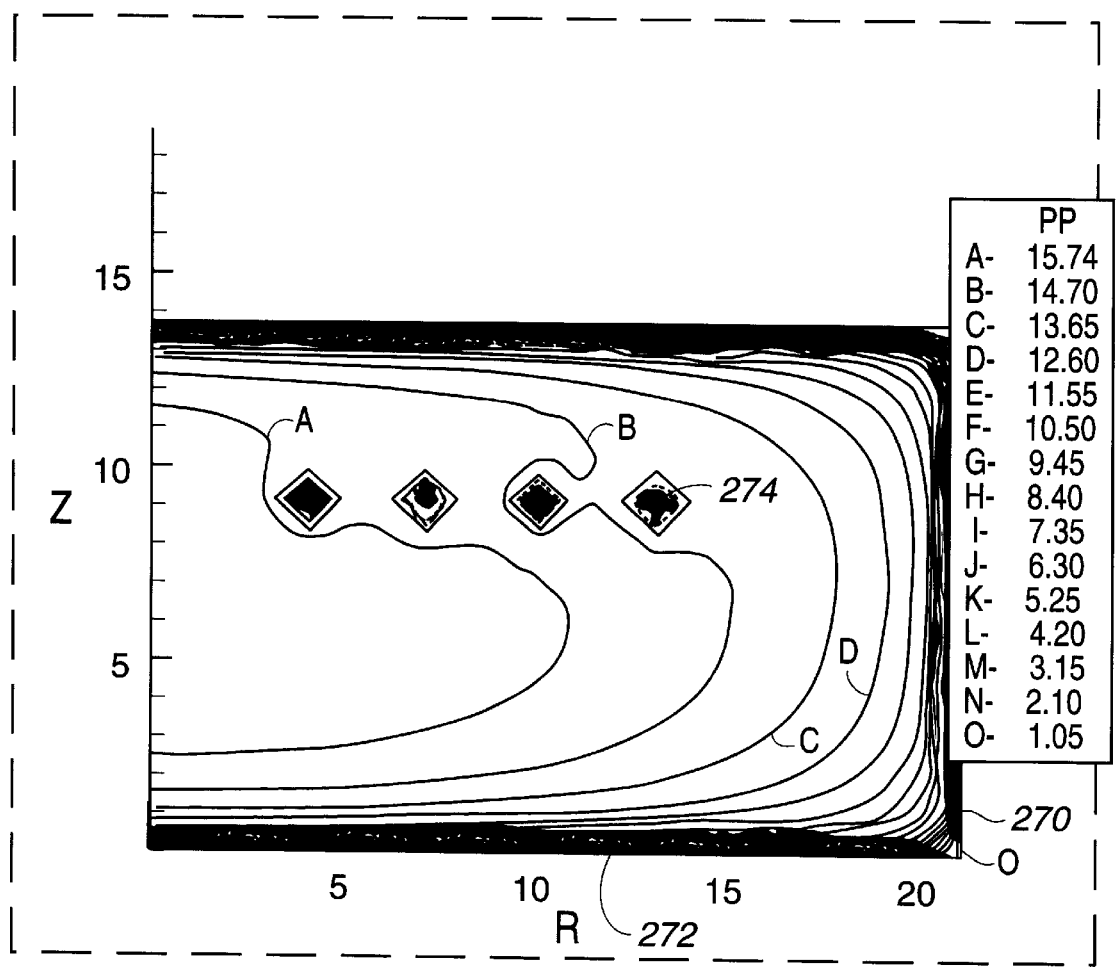
FIG. 10 is a graph depicting a computer simulation of the potential of the plasma generated by a coil in accordance with an alternative embodiment of the present invention.
Figure 11:
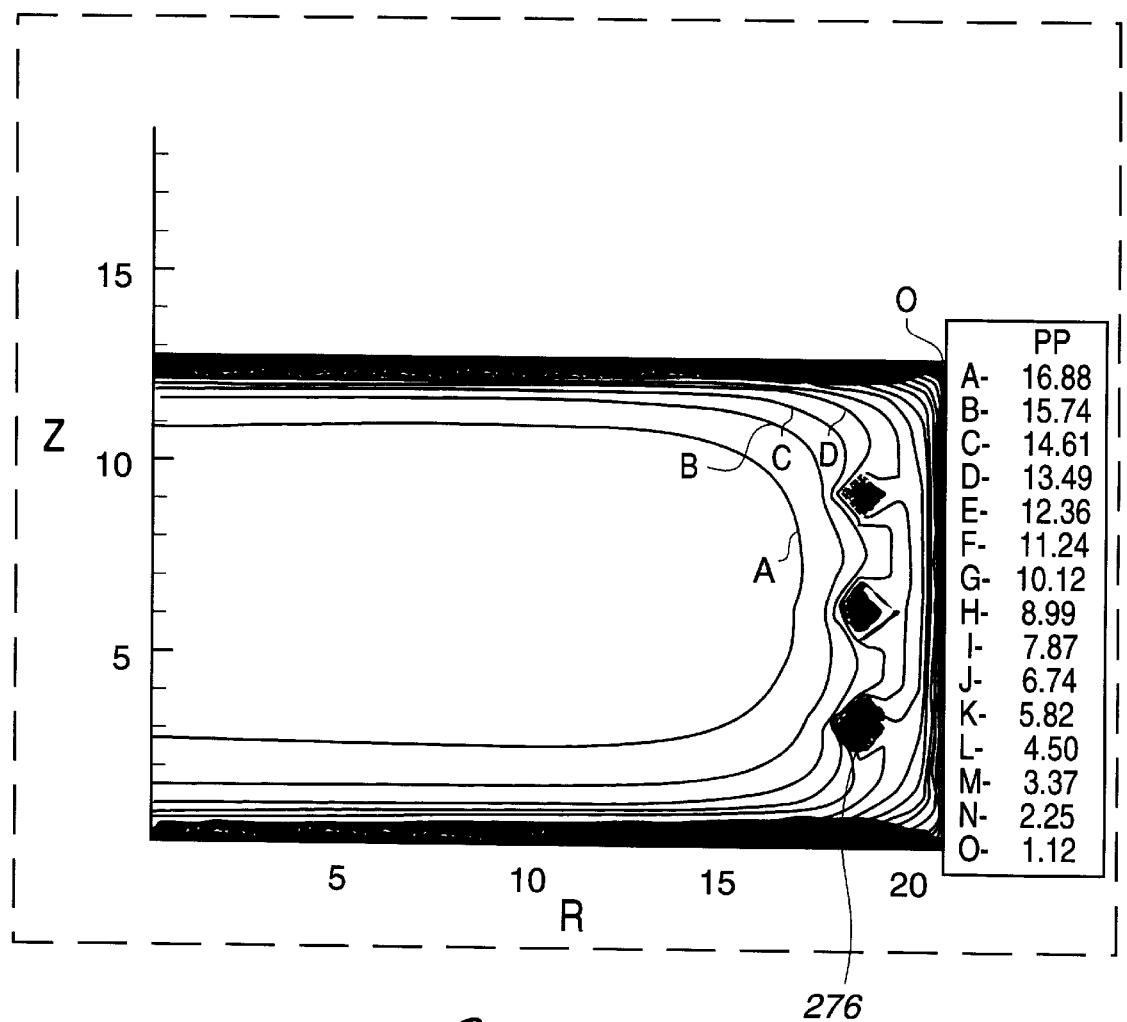
FIG. 11 is a graph depicting a computer simulation of the potential of the plasma generated by a prior coil.

FIGS. 10 and 11 illustrate computer simulations of the plasma potential of the plasma created within the interior space enclosed by a larger shield 270 for a larger wafer 272 having a radius of 15 cm. The computer simulation of FIG. 10 is calculated using a four turn spiral coil 274 located in the wafer deposition stream directly above the wafer in accordance with the present invention whereas the simulation of FIG. 11 is calculated using a helix coil 276 located recessed away from the wafer and the deposition stream directed toward the wafer. A comparison of the equipotential plasma lines illustrated in FIG. 6 to those of FIG. 10 make clear that the distribution of the plasma potential of the plasma simulated in FIG. 10 for the much larger chamber is substantially similar to that of the distribution illustrated in FIG. 6. Hence, a beneficial plasma potential distribution in accordance with the present invention is believed to be readily extended to larger chambers by adding additional turns to the coil as shown in FIG. 10. In contrast, the plasma potential simulated in FIG. 11 for the recessed coil 276 and larger wafer and chamber remains substantially constant at a given height over most of the wafer.

Figure 12:
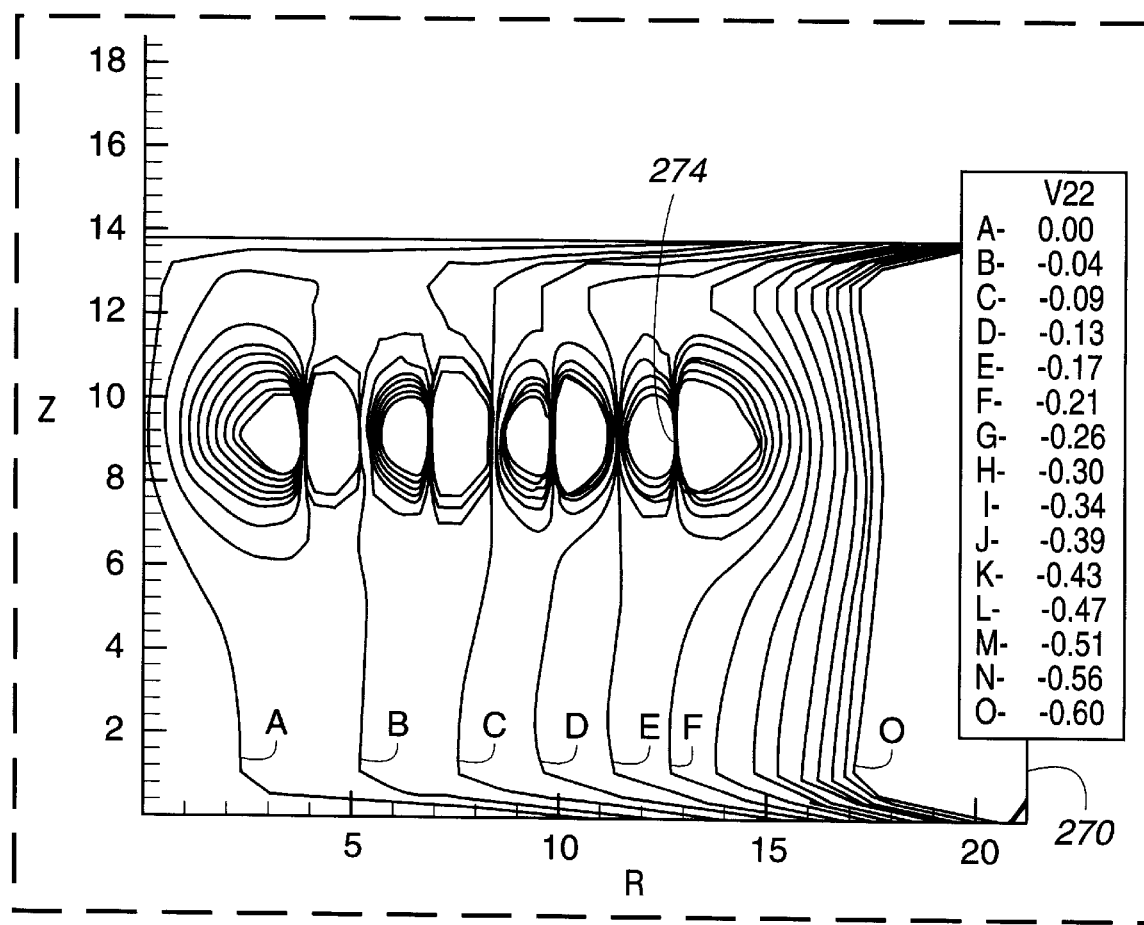
FIG. 12 is a graph depicting a computer simulation of the plasma potential gradient of the plasma generated by the coil of the chamber of FIG. 10.
Figure 13:
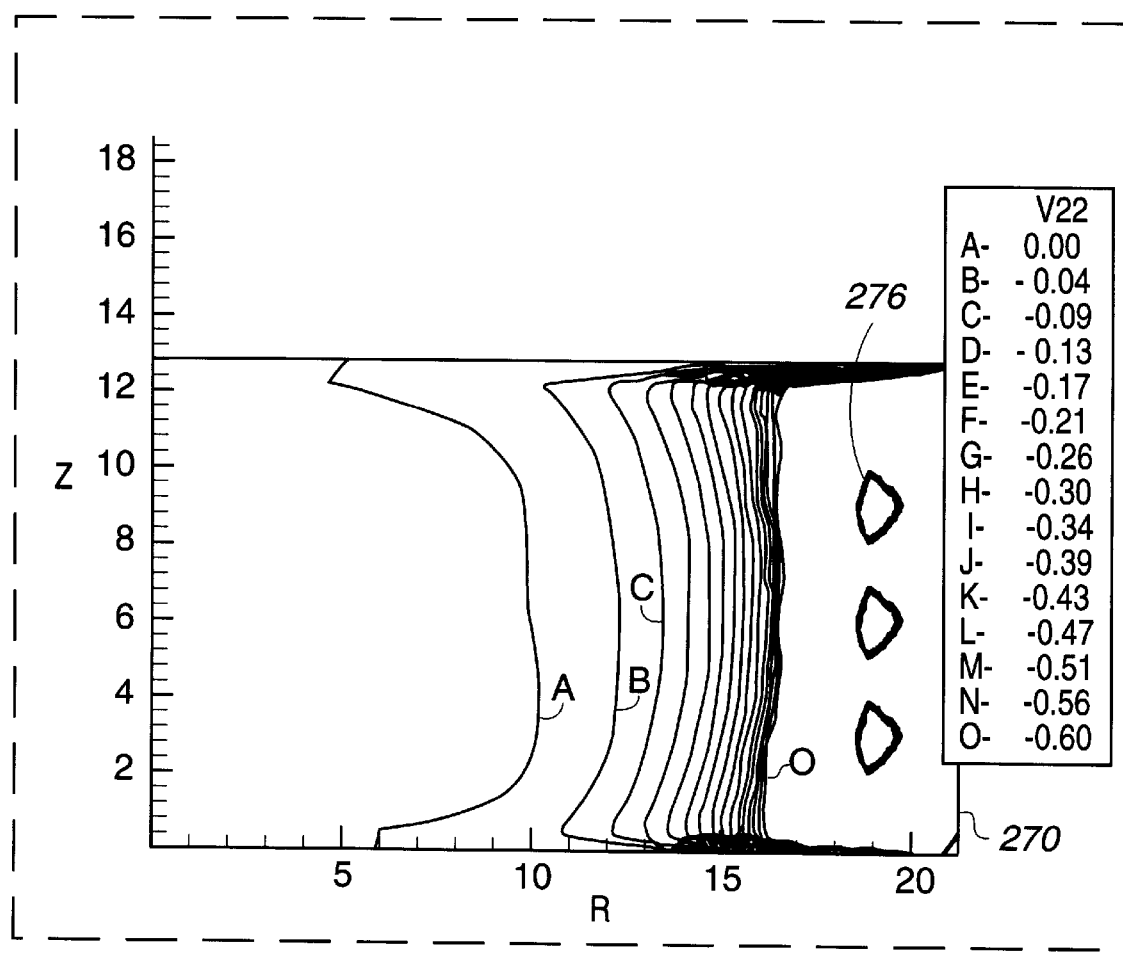
FIG. 13 is a graph depicting a computer simulation of the plasma potential gradient of the plasma generated by the coil of FIG. 11.

Computer simulations of the plasma potential gradients for the coils 274 and 276 are shown in FIGS. 12 and 13, respectively. The plasma potential gradient for the four turn coil 274 in the larger chamber 270 closely resembles the plasma potential gradient for the smaller chamber as shown in FIG. 8.

Exemplary values for the potential gradient calculated at nine selected points in the RF field of the coil 274 illustrated in FIG. 12 are shown in the following table.

TABLE 7

Potential Gradient For Coil 274

|          | R = 0.5 cm              | R = 5 cm               | R = 10 cm              |
|----------|-------------------------|------------------------|------------------------|
| Z = 2 cm | Point 1: −0.011182 v/cm | Point 2: −0.08016 v/cm | Point 3: −0.18491 v/cm |
| Z = 4 cm | Point 4: −0.012834 v/cm | Point 5: −0.07735 v/cm | Point 6: −0.180728 v/cm |
| Z = 6 cm | Point 7: −0.021402 v/cm | Point 8: −0.07683 v/cm | Point 9: −0.17615 v/cm |

Exemplary values for the potential gradient calculated at the same nine selected points of FIG. 12 but here in the simulation of the RF field of the coil 276 illustrated in FIG. 13 are shown in the following table.

TABLE 8

Potential Gradient For Coil 276

|          | R = 0.5 cm              | R = 5 cm                | R = 10 cm               |
|----------|-------------------------|-------------------------|-------------------------|
| Z = 2 cm | Point 1: −0.0035601 v/cm | Point 2: −0.017473 v/cm | Point 3: −0.036525 v/cm |
| Z = 4 cm | Point 4: −0.003309 v/cm  | Point 5: −0.0232525 v/cm | Point 6: −0.0302505 v/cm |
| Z = 6 cm | Point 7: −0.003033 v/cm  | Point 8: −0.022459 v/cm | Point 9: −0.01926 v/cm  |

The increased potential gradient of the simulation of the plasma generated by the coil 274 in accordance with the present invention in the interior zones as compared to that of the coil 276 may be quantized over exemplary selected distances as follows:

TABLE 9

| Potential Gradient:       | Location: |
|---------------------------|-----------|
| $|dV_{pp}/dR| \geq 0.009$ v/cm | R = 0.5 cm |
| $|dV_{pp}/dR| \geq 0.05$ v/cm  | R = 5 cm   |
| $|dV_{pp}/dR| \geq 0.08$ v/cm  | R = 10 cm  |

Thus, the potential gradient in the zone adjacent to the center of the wafer, for example, is such that the magnitude (absolute value) of the potential gradient is at least 0.009 v/cm in the simulation of the plasma created by the coil 274, as compared to 0.0035601, which is the magnitude calculated for the potential gradient of the simulation of the plasma created by the coil 276 in the zone adjacent to the wafer center.

The locations of the turns of coils 104 and 274 can be determined from the coordinate scales of FIGS. 6 and 10 respectively. While these figures show one-half of the shield 106 and the substrate, it will be understood that the other half of the plasma is mirror-symmetrical to the half which is illustrated, i.e., the equipotential lines and the equigradient lines or the plasma are symmetrical about the vertical, or Z, axis of the coordinate system, which axis passes through the origin of the coordinate system.

In view of the high degree of nonuniformity which can be imparted to a plasma field in accordance with the present invention, the possibility of successfully processing large diameter substrates, up to 300 mm and more in diameter, particularly for deposition of metal coatings, is presented. For example, it is contemplated that by adding additional turns to the coil, the extent of nonuniformity may be extended.

It should be noted that embodiments of the present invention can also include single turn coils and coils whose turns are spaced vertically from one another, i.e. constitute a cylindrical coil.

Figure 14:
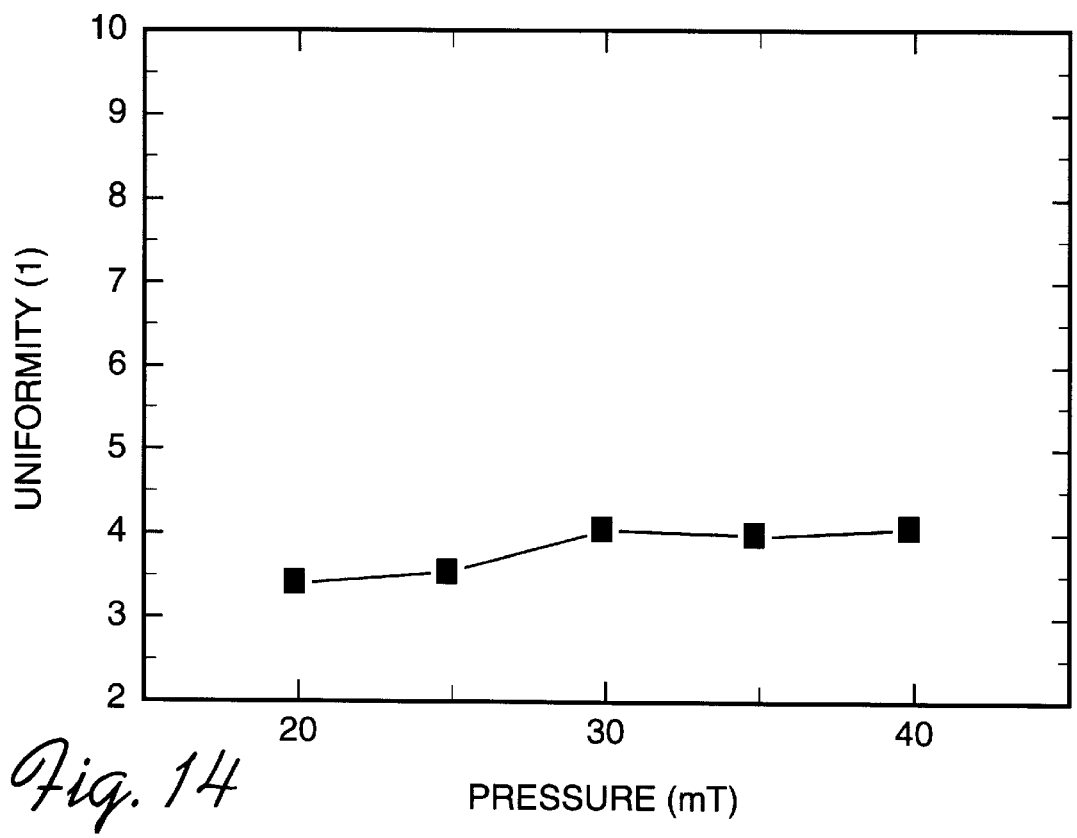
FIG. 14 is a graph depicting the uniformity of depositions as a function of various pressure levels for depositions produced in the chamber of FIG. 1.
Figure 15:
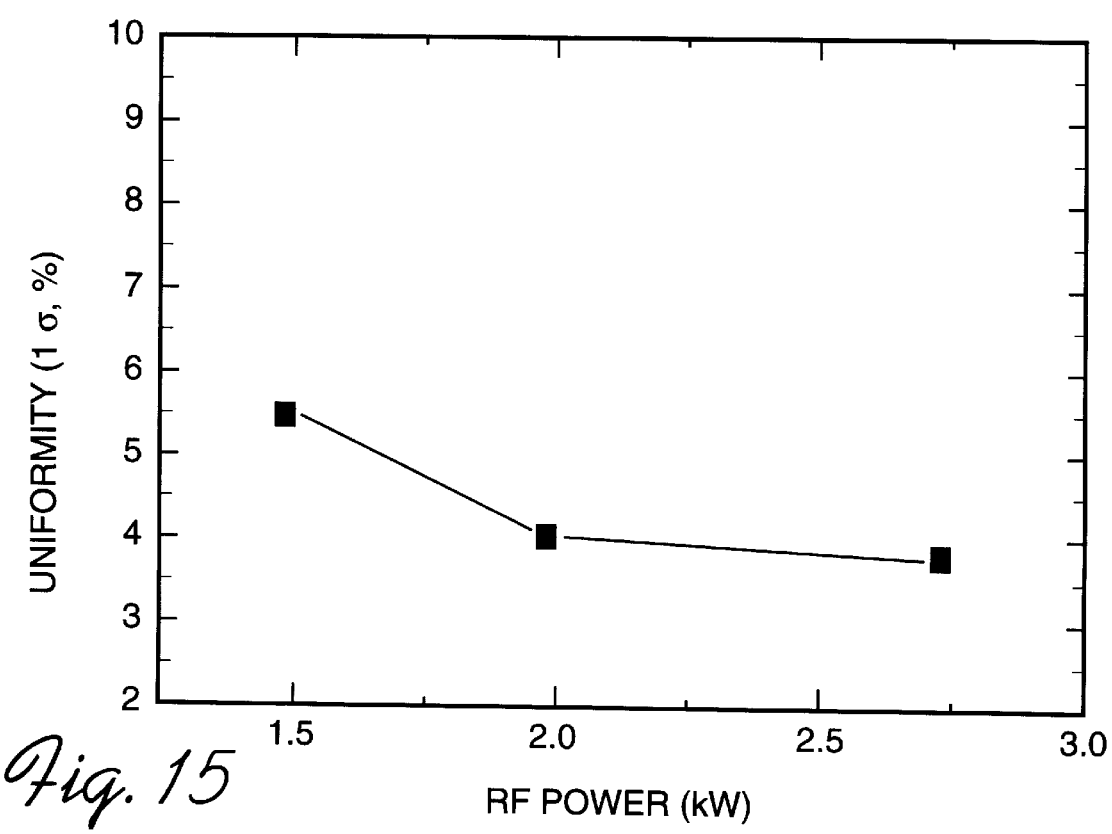
FIG. 15 is a graph depicting the uniformity of depositions as a function of various coil RF power levels for depositions produced in the chamber of FIG. 1.
Figure 16:
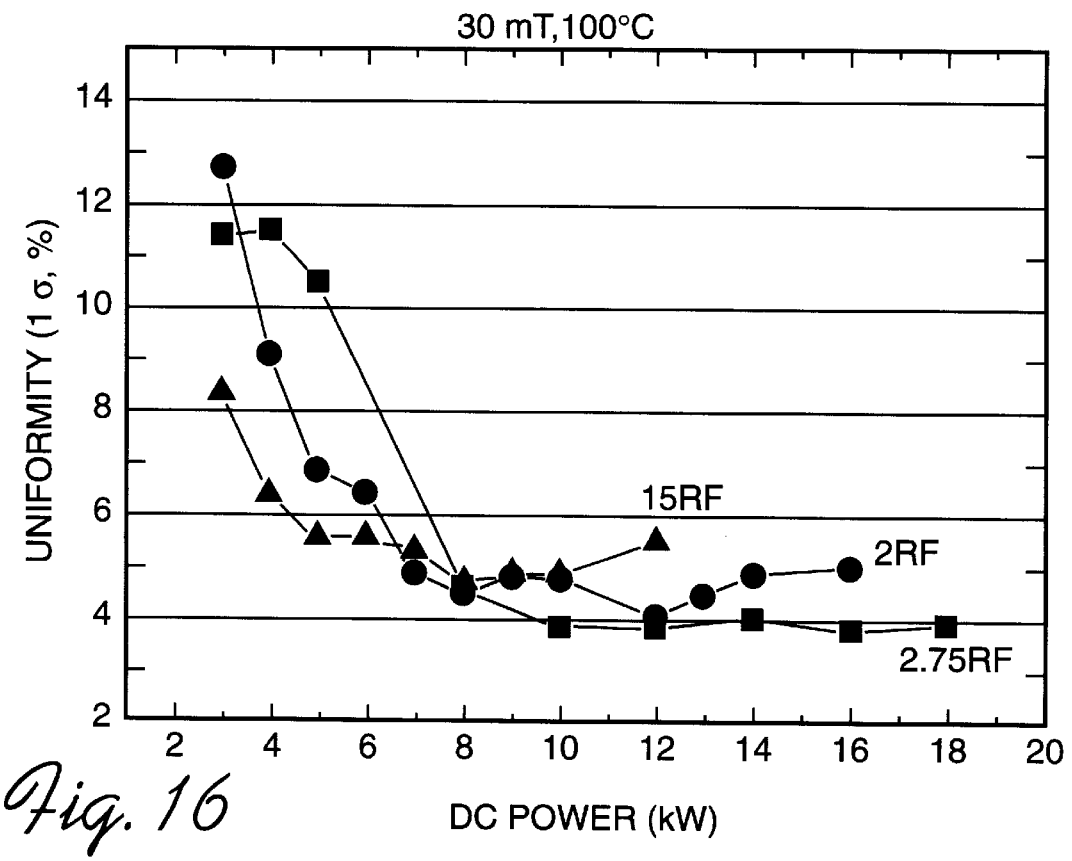
FIG. 16 is a graph depicting the uniformity of depositions as a function of various DC power levels applied to the target for depositions produced in the chamber of FIG. 1.

Referring now to FIGS. 14–16, it is shown that the uniformity which may be achieved utilizing a centrally placed coil to generate an inductively coupled plasma to deflect ionized deposition material is largely independent of chamber pressure, target power level and coil power level. More specifically, referring first to FIG. 14, it is shown that the degree of nonuniformity for a number of different depositions stays relatively constant (approximately 3–4%) for a water cooled titanium coil powered at 2.75 kW RF and a target powered as 12 kW DC as the pressure is varied from 20 mT to 40 mT. Similarly, FIG. 15 shows that the degree of nonuniformity for a number of different depositions stays relatively constant (approximately 4%) for a target powered at 12 kW DC as the RF power to the coil 104 is varied from 2.0 kW to 2.75 kW RF. Conversely, FIG. 16 shows that the degree of nonuniformity remains relatively constant (approximately 4%) for a water cooled titanium coil powered at 2.75 kW RF as the DC power to the target is varied from approximately 10 kW DC to 18 kW DC at 30 mT. For good throughput, it is preferred that the power to the target be sufficiently high to provide a deposition rate of at least 600 Å per minute, particularly for titanium depositions. For depositions of titanium nitride (TiN) or other nitrides, the resistivity and thickness nonuniformity may be maintained under 5.5%, particularly where the deposition rate maximum is greater than or equal to 200 Å/min, the minimum deposition rate is greater than or equal to 170 Å//min. and the pressures is at least 20 mT.

It can be very advantageous for the deposition uniformity to be relatively insensitive to the coil RF power, the target DC power and the chamber pressure levels. For example, the level of skill necessary to set up and maintain the system to achieve the desired level of uniformity may be reduced. In addition, these parameters can be adjusted to optimize other requirements such as ionization rate without adversely affecting uniformity. For example, high pressure (such as 30 mTorr) can facilitate a high ionization rate for improved bottom coverage of high aspect ratio vias and channels. However, high pressure also has a tendency to increase scattering which can adversely affect uniformity. By using a coil in accordance with the present invention, pressure can be increased to increase ionization without a substantial increase in nonuniformity. Similarly, In contrast, in some prior systems, adjusting a parameter such as DC power to the target to increase deposition rate can disrupt the uniformity of the deposition. Here, the DC power level to the target as well as other parameters may be readily adjusted without disrupting the uniformity of the deposition.

Figure 17:
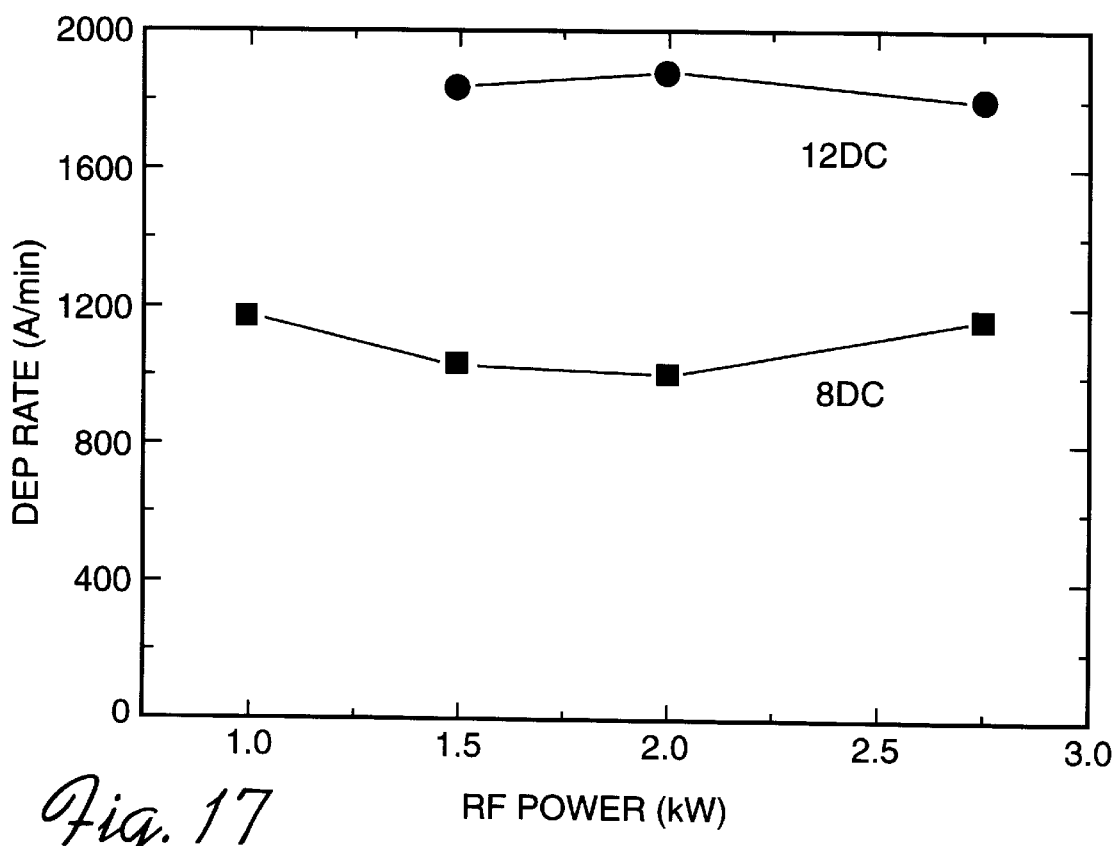
FIG. 17 is a graph depicting the deposition rates of depositions as a function of various coil RF power levels for depositions produced in the chamber of FIG. 1.

In addition to uniformity, it is also believed that the deposition rate is largely independent of RF power applied to the coil. Referring now to FIG. 17, it is shown that the deposition rate remains relatively constant as the RF power to the coil is varied from 1 kW to 2.75 kW at a particular DC power level applied to the target.

Figure 18A:
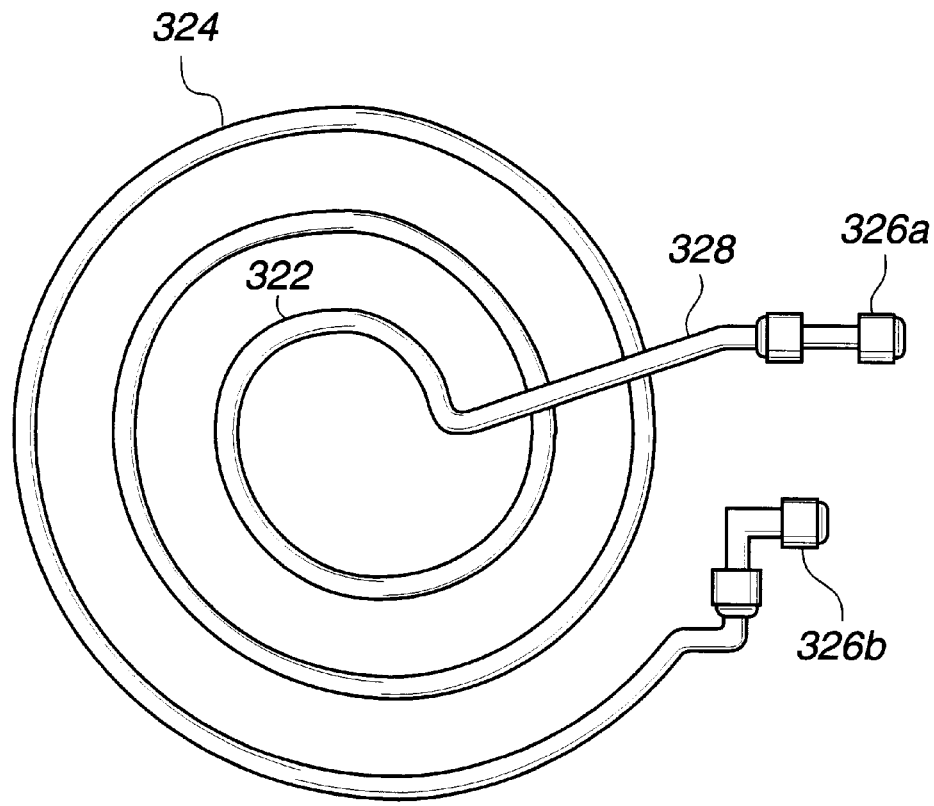
FIG. 18a is a top view of the coil of the chamber of FIG. 1.
Figure 18B:
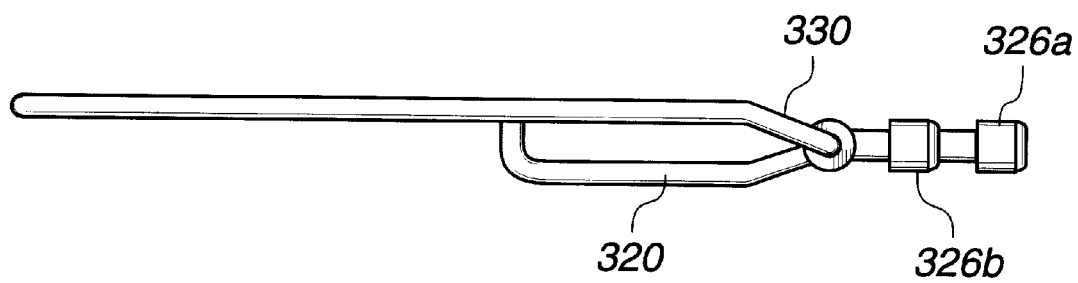
FIG. 18b is a side view of the coil of the chamber of FIG. 1.

The coil 104 of the illustrated embodiment is fabricated from hollow tubing wound in a relatively flat spiral as illustrated in FIGS. 18a and 18b. The coil 104 has approximately three turns spaced approximately 3 cm (1.2 inches) apart to provide a plasma potential gradient substantially as shown by the simulation of FIG. 8. Such an arrangement has been found to provide very satisfactory uniformity for a 200 mm (eight inch) substrate 112. As shown by the example of the coil 276, the number of turns and the spacing of the turns will vary depending upon various parameters including the sizes of the substrate and the target.

The coil 104 is formed of hollow tubing to permit water or other coolant fluids such as coolant gases to be circulated through the coil 104 to keep the temperature of the coil more constant. Reducing thermal cycling of the coil can reduce the generation of particulate matter from deposition material deposited onto the coil. Particulate matter which can fall onto and contaminate the substrate can be caused by thermal expansion and contraction of the coil as the coil temperature rises and falls each thermal cycle. By reducing such thermal cycling, the generation of undesirable particulate matter can correspondingly be reduced.

As discussed above, the coil 104 is supported by RF feedthroughs 320a and 320b (FIG. 1) which pass through the shield 106. The feedthrough 320a couples the inner turn 322 to the RF generator 300 (FIG. 2) through the match circuit 306. Besides RF energy, the feedthrough 320a also channels water to the coil 104. The feedthrough 320b couples the outer turn 324 of the coil 104 to ground through the blocking capacitor 308 FIG. 2). The feedthrough 320b also receives the heated water from the coil 104, which is piped to a heat exchanger (not shown) where the water is cooled prior to being returned to the coil 104.

In the illustrated embodiment, the top of the coil 104 is spaced 4–5 cm below the generally planar target 110 and the coil 104 is spaced 8–9 cm above the substrate. Spacing the coil approximately the third of the distance from the target to the substrate has been found to provide satisfactory uniformity of deposition. However, the actual values will vary depending upon the application including the substrate, target and chamber sizes, shapes and related positions.

The use of hollow tubing to form the coil 104 provides a relatively stiff structure which resists sagging and distortion which can adversely affect the operation of the coil. In addition, the coil 104 weighs substantially less than coils wound in a helix adjacent to the shield 106. As a consequence, the coil 104 can be supported merely by the two feedthroughs 320a and 320b. Prior helix ribbon coils have required support standoffs in addition to the RF feedthroughs for proper support of the coil. Because of the relatively light weight and stiff construction of the coil 104, the need for additional standoffs or other supports is avoided. As a consequence, the number of structural elements which can generate particulate matter in the chamber and increase costs of construction is correspondingly reduced.

The coil 104 has a pair of threaded connectors 326a and 326b (FIGS. 18a and 18b) which connect to the feedthroughs 320a and 320b. A portion 328 of the coil 104 couples the inner turn 322 to the connector 326a. Another portion 330 of the coil 104 couples the outer turn 324 to the second connector 326b. As best seen in FIG. 18b, the coil portions 328 and 330 are bent at inclines so that the connectors 326a and 326b are substantially coplanar in a plane offset from the plane of the spiral turns of the coil by approximately 0.33 inches. Of course, the coil may be coupled to RF and coolant sources and supported in the chamber in a variety of manners.

The tubing material for fabricating the coil 104 is preferably made of the same material as the target material because material can sputter off the coil as well as the target. Hence, if the target is made of titanium, the coil tubing may be made of or at least coated with the same grade of titanium as the target. Alternatively, if copper or aluminum is being sputtered, the coil may be made from corresponding materials. However, it is believed that sputtering from the coil is not needed to achieve satisfactory uniformity for many applications. Hence, the coil may be powered in such a way as to minimize sputtering of the coil itself. As a result, the life of the coil may be extended.

Figure 19A:
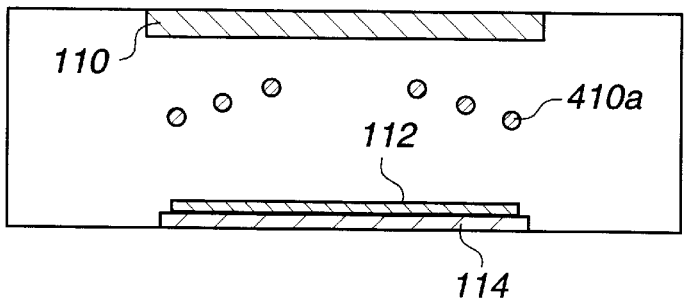
FIGS. 19a and 19b are schematic cross-sectional views of alternative embodiments of the plasma chamber of FIG. 1.
Figure 19B:
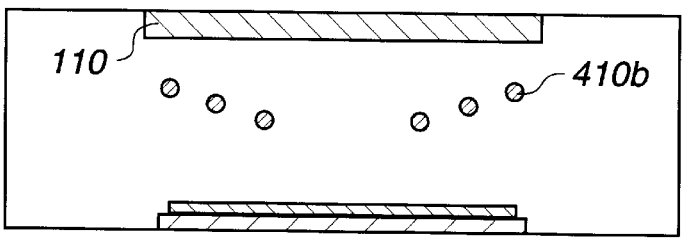

FIGS. 19a and 19b show two alternative embodiments. Instead of a generally flat planar spiral coil, the chambers of FIGS. 19a and 19b have cone-shaped spiral tubular coils 410a and 410b, respectively. Although the flat spiral coil 104 of FIGS. 18a and 18b may be somewhat easier to fabricate, the coil 410b and especially the inverted coil 410a may generate a plasma potential gradient with improved ion deflection capabilities resulting in correspondingly improved uniformity. Other coil shapes are of course possible including coils having concentric circular turns rather than a spiral.

Figure 20:
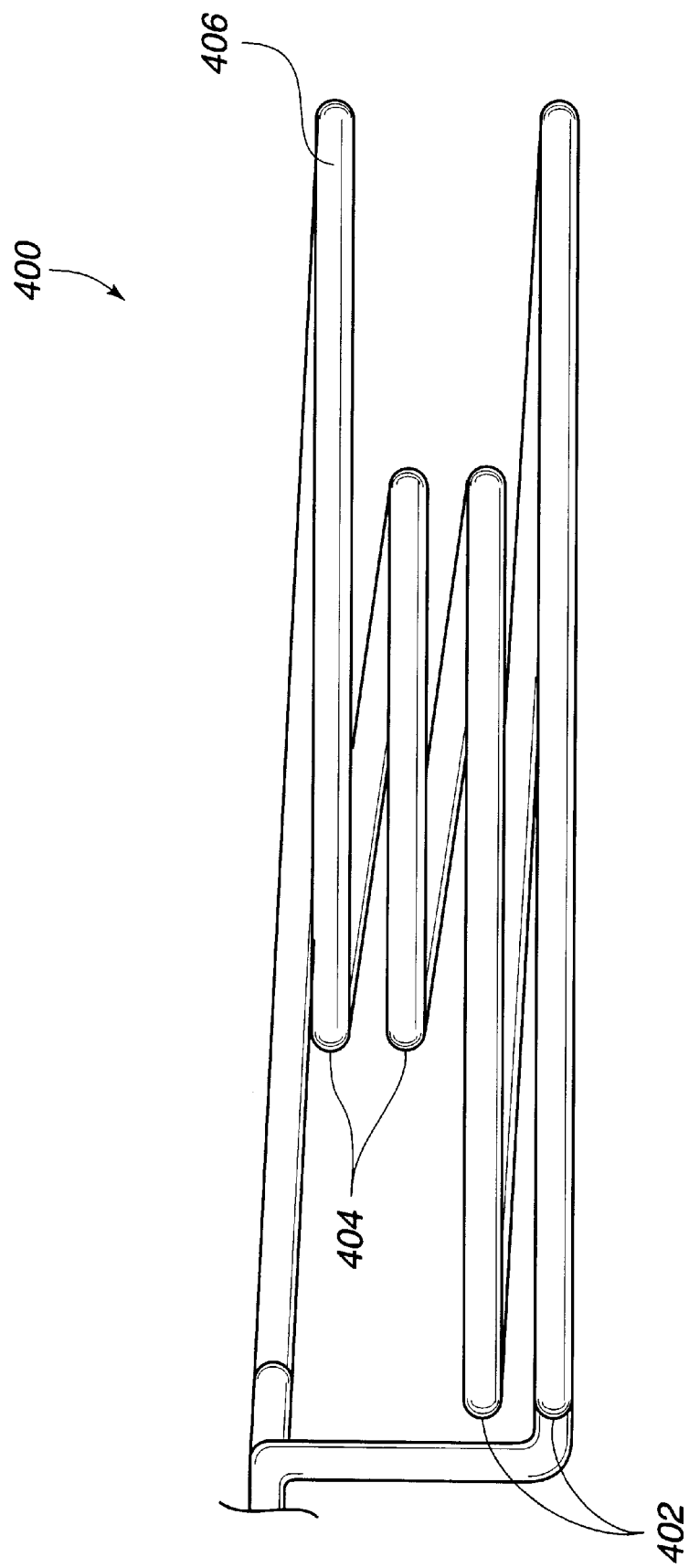
FIG. 20 is a side view of a coil in accordance with another embodiment of the present invention.

FIG. 20 shows an RF coil 400 in accordance with an alternative embodiment which, in addition to coupling RF energy into the plasma, is intended to function primarily by blocking a portion of the stream of deposition material. The coil 400 is formed as a triple helix having a first plurality of helix shaped outer turns 402 of a first diameter, a second plurality of helix shaped inner turns 404 of a second, smaller diameter and a second outer turn 406 of a third diameter of substantially the same size as the first diameter. It is seen that the inner helix of turns 404 provides a "chimney" effect of blocking a portion of the stream of deposition material, particularly in center portion of the deposition stream. Such a blocking action may have an advantageous effect in certain applications. In the illustrated embodiment, the outer turns 402, 406 of the coil 400 have a diameter of 240 mm and the inner turns 404 have a diameter of 50 mm. Of course, the actual dimensions will vary depending upon the particular application including the size of the substrate, the size of the target, and the degree of blocking desired. In some applications, it is contemplated that the RF current to the coil may be turned off so that the coil operates solely in a blocking function.

Figure 21:
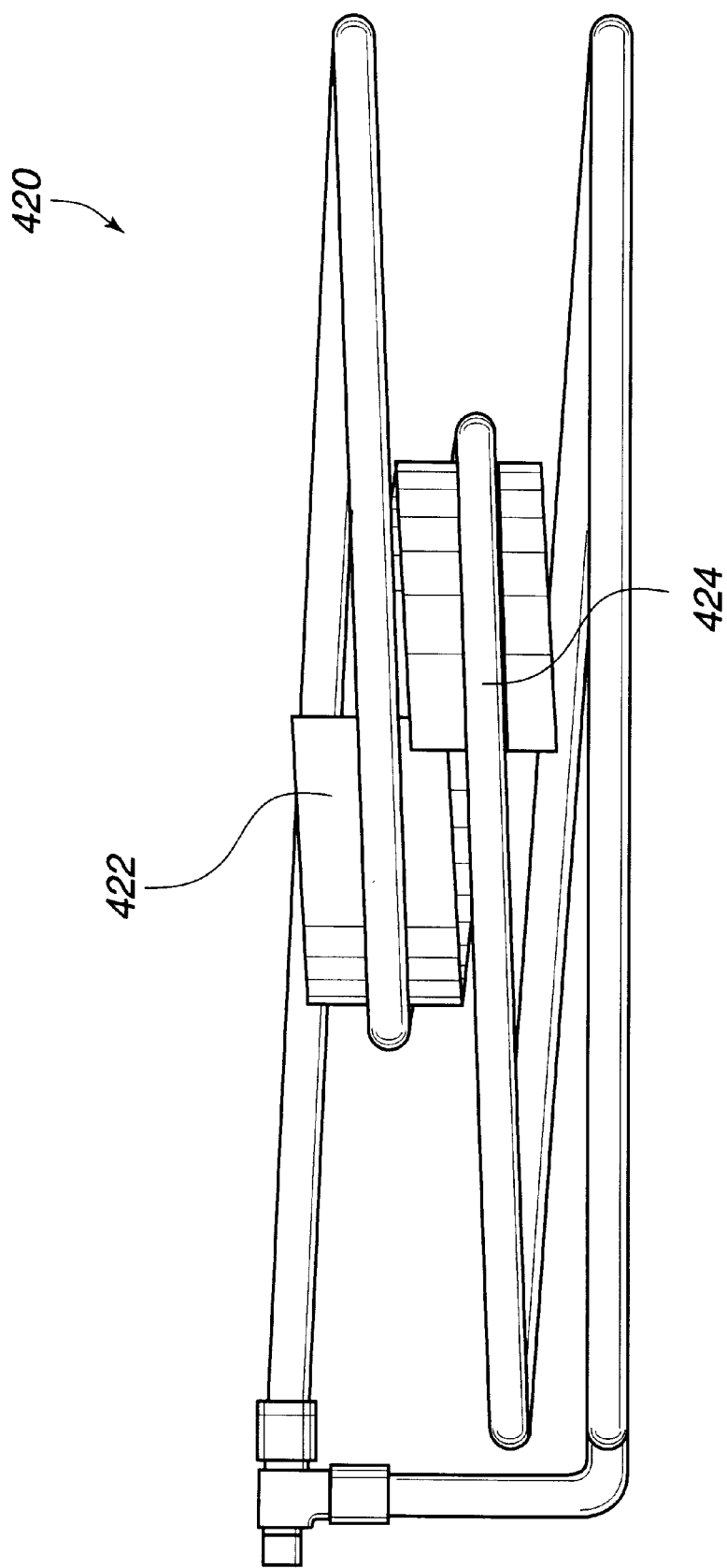
FIG. 21 is a side view of a coil in accordance with yet another embodiment of the present invention.

FIG. 21 shows an RF coil 420 in accordance with another embodiment in which a helix shaped flange 422 has been attached to an inner helix of turns 424. Such a flange 422 is believed to enhance the blocking function of the inner helix of turns 424 of the coil 420. Thus, the inner helix 424 of the coil 420 may have fewer turns than the inner helix 404 of the coil 400 and yet provide comparable blocking action.

Experimental data has shown that the coil 104 which is believed to rely primarily upon deposition material deflection rather than blocking, can provide better uniformity in at least some applications as compared to the coils 400 and 402 which are believed to rely primarily upon blocking deposition material.

In each of the embodiments discussed above, a multiple turn coil 104 was used, but, of course, a single turn coil may be used instead. Still further, instead of the tubular shape illustrated, ribbon coils may be used as well as flat, open-ended annular rings as described in copending application Ser. No. 08/680,335, now abandoned entitled "Coils for Generating a Plasma and for Sputtering," filed Jul. 10, 1996 (Attorney Docket No. 1390-CIP/PVD/DV) and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 pending and entitled "Method And Apparatus For Launching a Helicon Wave in a Plasma" (Attorney Docket No. 938).

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 28 MHz may be satisfactory. An RF power setting of 1.5 kW is preferred but a range of 1.5–5 kW is satisfactory. In addition, a DC power setting for biasing the target 110 of 8–12 kW is preferred but a range of 2–24 kW and a pedestal 114 bias voltage of –30 volts DC are satisfactory. The above parameters may vary depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–50 mTorr. For ionized PVD, a pressure between 10 and 100 mTorr such as 30 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication system for sputtering material onto a workpiece, the system comprising:
   a chamber having a plasma generation area within said chamber;
   a target carried by said chamber, said target having a center and comprising a target material to be sputtered from said target;
   a platform adapted to hold a workpiece having a center axis and an edge, at least a portion of which workpiece edge defines a volume between said workpiece and said target; and
   a coil carried by said chamber and positioned to couple energy into said plasma generation area to generate a plasma in said plasma generation area to ionize said sputtered target material, wherein said coil has at least one turn, positioned in said volume and sufficiently close to said workpiece center axis to generate a plasma potential gradient which deflects sputtered target material away from said workpiece center.

2. The system of claim 1 wherein said plasma potential decreases by at least 0.75 volts at a predetermined distance from said workpiece from a point aligned with the center axis of said workpiece to a point aligned with the edge of said workpiece.

3. The system of claim 2 wherein said predetermined distance from said workpiece includes distances less than or equal to one half the distance from said workpiece to said coil.

4. The system of claim 3 wherein said predetermined distance from said workpiece includes distances equal to one half the distance between said coil and said workpiece.

5. The system of claim 4 wherein predetermined distance from said workpiece includes distances equal to one fourth the distance from said workpiece to said coil.

6. The system of claim 1 wherein the magnitude of said plasma potential gradient at a predetermined distance from said workpiece at a point aligned with the center axis of said workpiece is at least 0.01 v/cm.

7. The system of claim 1 wherein the magnitude of said plasma potential gradient at a predetermined distance from said workpiece at a point aligned with a point midway between the center axis of said workpiece and the edge of said workpiece is at least 0.07 v/cm.

8. The system of claim 1 wherein the magnitude of said plasma potential gradient at a predetermined distance from said workpiece at a point aligned with the center axis of said workpiece is at least 0.009 v/cm.

9. The system of claim 1 wherein the magnitude of said plasma potential gradient at a predetermined distance from said workpiece at a point aligned with a point one third the distance from said center axis of said workpiece to the edge of said workpiece is at least 0.05 v/cm.

10. The system of claim 1 wherein the magnitude of said plasma potential gradient at a predetermined distance from said workpiece at a point aligned with a point two thirds the distance from said center axis of said workpiece to the edge of said workpiece is at least 0.08 v/cm.

11. The system of claim 1 wherein said plasma potential decreases by at least 0.65 volts at a predetermined distance from said workpiece from a point aligned with the center axis of said workpiece to a point aligned with the edge of said workpiece.

12. The system of claim 11 wherein said predetermined distance from said workpiece includes distances equal to three-fourths the distance from said workpiece to said coil.

13. The system of claim 1 wherein said plasma potential decreases by at least 0.07 volts at a predetermined distance from said workpiece from the midpoint between said center axis and said edge of said workpiece to a point aligned with the edge of said workpiece.

14. The system of claim 1 wherein said coil is a spiral-shaped coil centered on said center axis.

15. The system of claim 14 wherein said spiral-shaped coil is substantially coplanar.

16. The system of claim 14 wherein said spiral-shaped coil is frusto-conically shaped.

17. The system of claim 1 wherein said coil has a plurality of turns, each turn having a different diameter.

18. The system of claim 1 wherein said coil includes a hollow tube adapted to carry a coolant fluid through said hollow tube.

19. The system of claim 1 wherein said coil is spaced from said target approximately one third the distance between said target and said workpiece.

20. The system of claim 1 wherein said entire coil vertically overlaps said workpiece.

21. The system of claim 20 wherein at least a majority of said coil is positioned in said volume.

22. The system of claim 21 wherein said coil has a diameter and said coil has a plurality of turns, each turn having a different diameter wherein the outer diameter of the turn with the largest diameter is substantially equal to the diameter of the workpiece.

23. The system of claim 1 wherein said target material sputtered from said target defines a stream of target material directed toward said workpiece and wherein said coil is positioned in said stream so that a portion of said stream of target material is blocked from reaching said workpiece.

24. The system of claim 23 wherein the coil comprises a hollow tube and a flange attached to the hollow tube to block a portion of said sputtered material.

25. The system of claim 1 wherein said volume is a cylindrical volume centered on said workpiece central axis and having a radius determined by said portion of said workpiece edge.

26. A semiconductor fabrication system for sputtering material onto a workpiece, the system comprising:
  a chamber having a plasma generation area within said chamber;
  a target carried by said chamber, said target having a substantially planar target surface comprising a target material to be sputtered from said target;
  a platform adapted to hold a workpiece having a center axis and a periphery, at least a portion of which workpiece periphery defines a volume between said workpiece and said target;
  a multi-turn spiral-shaped coil carried by said chamber and positioned to couple energy into said plasma generation area to generate a plasma in said plasma generation area to ionize said sputtered target material, wherein said coil is spaced approximately one-third the distance from said target surface to said workpiece and at least one of said turns of said coil is positioned in said volume and sufficiently close to said workpiece center axis to generate a plasma potential gradient which deflects sputtered target material away from said workpiece center.

27. The system of claim 26 wherein said volume is a cylindrical volume centered on said workpiece central axis and having a radius determined by said portion of said workpiece periphery.

28. A process for sputter depositing a layer of material onto a workpiece, comprising:
  sputtering a target of a material to form a stream of sputtered target material directed toward a workpiece having a periphery, at least a portion of which workpiece periphery defines a volume between said workpiece and said target;
  ionizing a portion of said stream of sputtered target material using a plasma generated by an RF powered coil positioned in said stream of sputtered material and having at least one turn positioned in said volume; and
  deflecting a portion of said stream of sputtered material away from the center of said workpiece using a potential gradient of said plasma wherein the nonuniformity of deposition of said sputtered material on said workpiece is within a predetermined maximum.

29. The process of claim 28 wherein said coil is a spiral-shaped coil centered on said center axis.

30. The process of claim 29 wherein said spiral-shaped coil is substantially coplanar.

31. The process of claim 29 wherein said spiral-shaped coil is frusto-conically shaped.

32. The process of claim 28 wherein said coil is has a plurality of turns, each turn having a different diameter.

33. The process of claim 28 wherein said coil includes a hollow tube adapted to carry a coolant fluid through said hollow tube.

34. The process of claim 28 wherein said coil is spaced from said target approximately one third the distance between said target and said workpiece.

35. The process of claim 28 wherein said entire coil vertically overlaps said workpiece.

36. The process of claim 35 wherein at least a majority of said coil is positioned in said volume.

37. The process of claim 36 wherein said coil has a diameter and each turn has a different diameter wherein the outer diameter of the turn with the largest diameter is substantially equal to the diameter of the workpiece.

38. The process of claim 28 further comprising blocking a portion of said stream of deposition material from reaching said workpiece using said coil positioned in said stream so that a portion of said target material is deposited onto said coil rather than reaching said workpiece.

39. The process of claim 38 wherein the coil comprises a hollow tube and a flange attached to the hollow tube to block a portion of said sputtered material.

40. The process of claim 28 wherein said plasma potential decreases by at least 0.75 volts at a predetermined distance between said workpiece and said target from a point aligned with the center axis of said workpiece to a point aligned with the edge of said workpiece.

41. The process of claim 40 wherein said predetermined distance from said workpiece includes distances less than or equal to one half the distance from said workpiece to said coil.

42. The process of claim 41 wherein said predetermined distance from said workpiece includes distances equal to one half the distance between said coil and said workpiece.

43. The process of claim 42 wherein said predetermined distance from said workpiece includes distances equal to one fourth the distance from said workpiece to said coil.

44. The process of claim 28 wherein said plasma potential decreases by at least 0.65 volts at a predetermined distance from said workpiece from a point aligned with the center axis of said workpiece to a point aligned with the edge of said workpiece.

45. The process of claim 28 wherein said predetermined distance from said workpiece includes distances equal to three-fourths the distance from said workpiece to said coil.

46. The process of claim 28 wherein said plasma potential decreases by at least 0.07 volts at a predetermined distance from said workpiece from the midpoint between said center axis and said edge of said workpiece to a point aligned with the edge of said workpiece.

47. The process of claim 28 wherein the magnitude of said plasma potential gradient at a predetermined distance from said workpiece at a point aligned with the center axis of said workpiece is at least 0.01 v/cm.

48. The process of claim 28 wherein the magnitude of said plasma potential gradient at a predetermined distance from said workpiece at a point aligned with a point midway between the center axis of said workpiece and the edge of said workpiece is at least 0.07 v/cm.

49. The process of claim 28 wherein the magnitude of said plasma potential gradient at a predetermined distance from said workpiece at a point aligned with the center axis of said workpiece is at least 0.009 v/cm.

50. The process of claim 28 wherein the magnitude of said plasma potential gradient at a predetermined distance from said workpiece at a point aligned with a point one third the distance from said center axis of said workpiece to the edge of said workpiece is at least 0.05 v/cm.

51. The process of claim 28 wherein the magnitude of said plasma potential gradient at a predetermined distance from said workpiece at a point aligned with a point two thirds the distance from said center axis of said workpiece to the edge of said workpiece is at least 0.08 v/cm.

52. The method of claim 28 wherein said volume is a cylindrical volume centered on said workpiece central axis and having a radius determined by said portion of said workpiece periphery.

* * * * *